(12) United States Patent
Liao et al.

(10) Patent No.: US 11,237,483 B2
(45) Date of Patent: Feb. 1, 2022

(54) METHOD AND APPARATUS FOR CONTROLLING DROPLET IN EXTREME ULTRAVIOLET LIGHT SOURCE

(71) Applicant: TAIWAN SEMICONDUCTOR MANUFACTURING CO., LTD., Hsinchu (TW)

(72) Inventors: Chi-Hung Liao, New Taipei (TW); Yueh-Lin Yang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/901,552

(22) Filed: Jun. 15, 2020

(65) Prior Publication Data
US 2021/0389680 A1 Dec. 16, 2021

(51) Int. Cl.
*G03F 7/20* (2006.01)
*H01L 21/027* (2006.01)
*H05G 2/00* (2006.01)

(52) U.S. Cl.
CPC ........ *G03F 7/70033* (2013.01); *G03F 7/2004* (2013.01); *G03F 7/2008* (2013.01); *G03F 7/70041* (2013.01); *G03F 7/7055* (2013.01); *H01L 21/0275* (2013.01); *H05G 2/006* (2013.01)

(58) Field of Classification Search
CPC .. G03F 7/70033; G03F 7/70041; H05G 2/006
See application file for complete search history.

(56) References Cited

U.S. PATENT DOCUMENTS

| | | | |
|---|---|---|---|
| 7,110,504 B2* | 9/2006 | Kasumi | B82Y 10/00 250/492.2 |
| 7,897,947 B2* | 3/2011 | Vaschenko | H05G 2/006 250/504 R |
| 8,158,960 B2* | 4/2012 | Vaschenko | H05G 2/008 250/504 R |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 8,967,826 B2* | 3/2015 | Mikhailov | G02B 27/095 362/247 |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,992,856 B2* | 6/2018 | Shen | G21K 1/067 |

(Continued)

*Primary Examiner* — Steven Whitesell Gordon
(74) *Attorney, Agent, or Firm* — Maschoff Brennan

(57) ABSTRACT

A lithography method in semiconductor fabrication is provided. The method includes generating multiple groups of small drops of a target material through a number of nozzles in such a way that small drops in each of the groups are aggregated to an elongated droplet of the target material. The method also includes generating a laser pulse from a laser generator to convert the elongated droplets to plasma which generates an EUV radiation. The method further includes exposing a semiconductor wafer to the EUV radiation.

20 Claims, 16 Drawing Sheets

(56) References Cited

U.S. PATENT DOCUMENTS

| | | | |
|---|---|---|---|
| 2004/0159802 A1* | 8/2004 | Ziener | H05G 2/006 250/504 R |
| 2006/0017026 A1* | 1/2006 | Hergenhan | H05G 2/005 250/504 R |
| 2014/0284502 A1* | 9/2014 | Nakano | H01L 22/10 250/504 R |
| 2015/0264791 A1* | 9/2015 | Nikipelov | H05G 2/006 250/504 R |
| 2015/0268559 A1* | 9/2015 | Badie | G03F 7/70033 430/322 |
| 2015/0380200 A1* | 12/2015 | Behling | H01J 35/112 378/124 |
| 2016/0113100 A1* | 4/2016 | Wu | G21K 1/067 355/67 |
| 2016/0113101 A1* | 4/2016 | Wu | H05G 2/008 250/492.2 |
| 2016/0116332 A1* | 4/2016 | Wu | G03F 7/70033 250/372 |
| 2016/0227638 A1* | 8/2016 | Hori | H05G 2/008 |
| 2016/0377848 A1* | 12/2016 | Wu | H05G 2/006 250/504 R |

\* cited by examiner

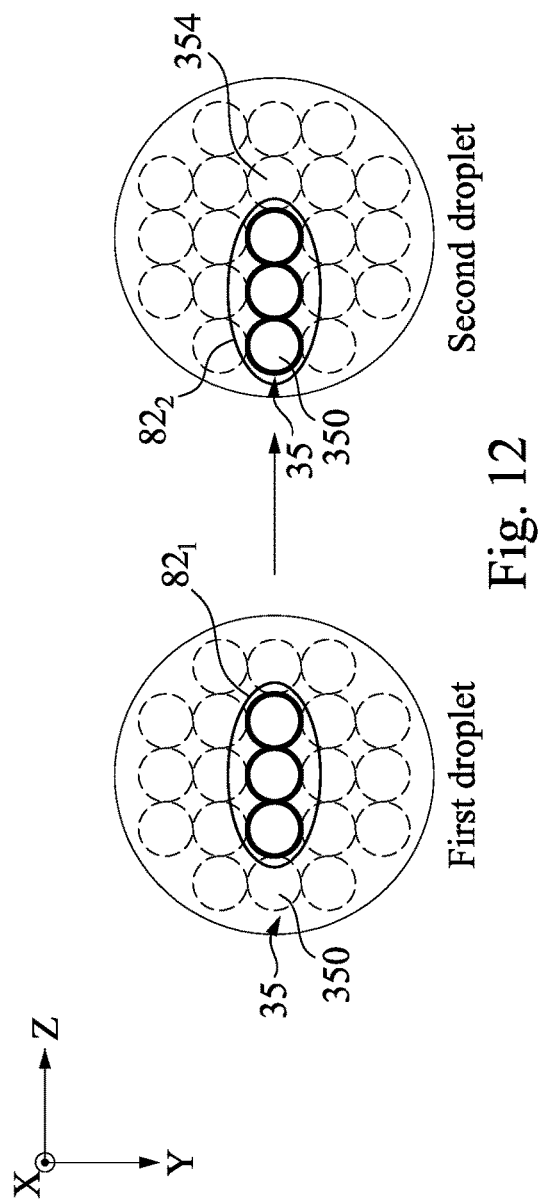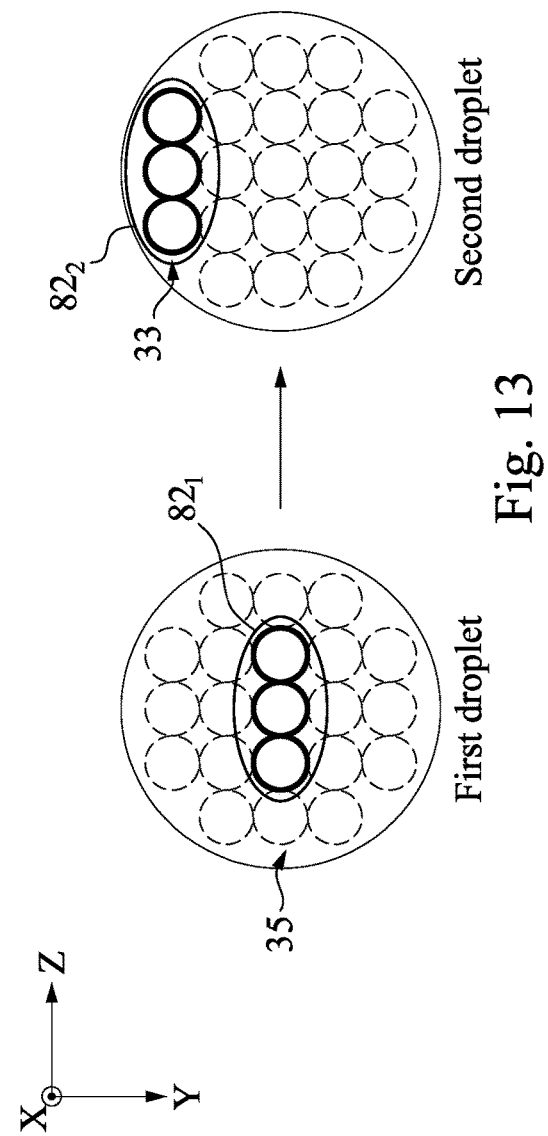

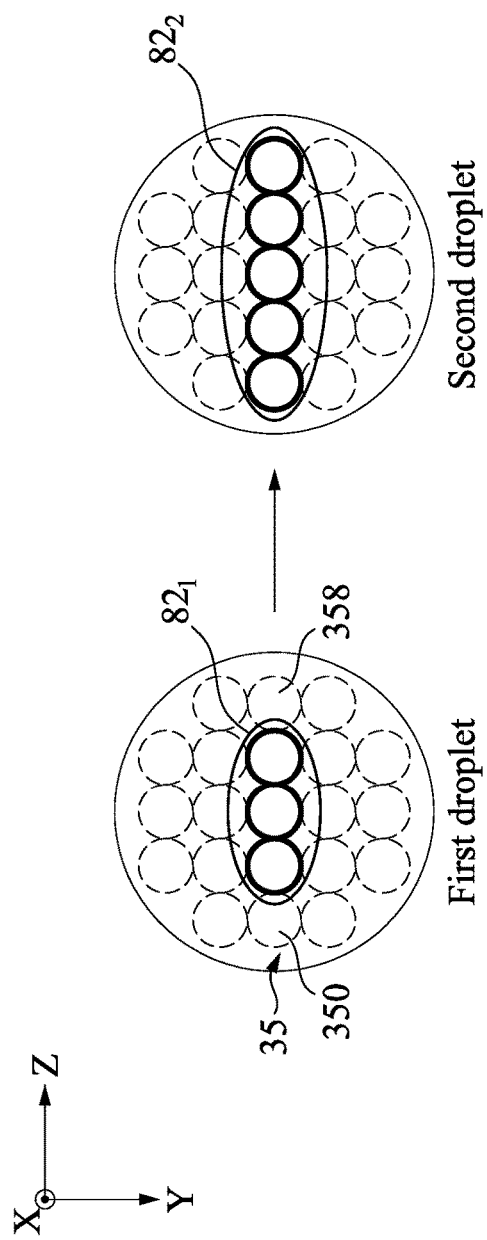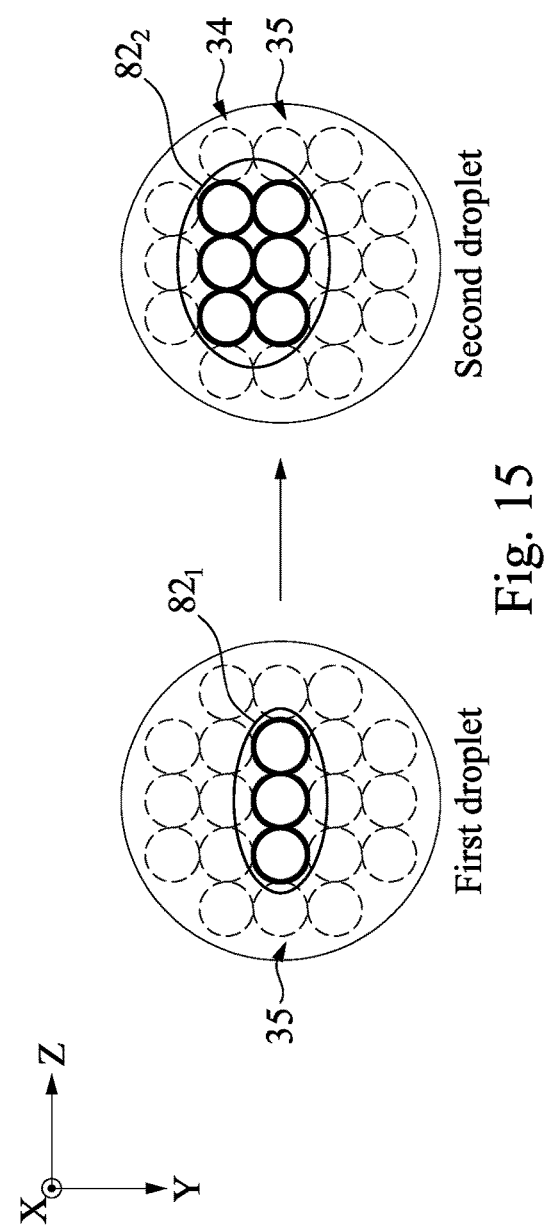

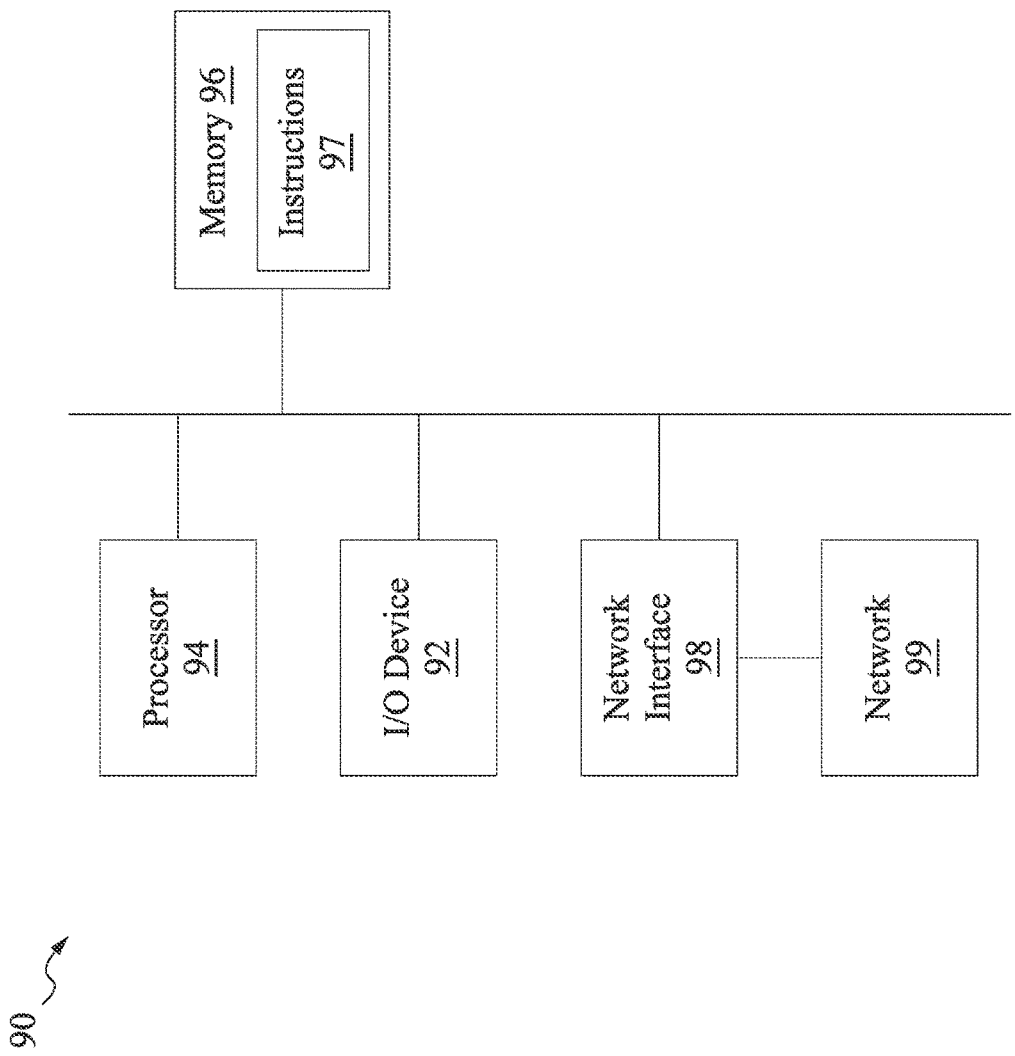

METHOD AND APPARATUS FOR CONTROLLING DROPLET IN EXTREME ULTRAVIOLET LIGHT SOURCE

BACKGROUND

The demand for computational power has increased exponentially. This increase in computational power is met by increasing the functional density, i.e., number of interconnected devices per chip, of semiconductor integrated circuits (ICs). With the increase in functional density, the size of individual devices on the chip has decreased. The decrease in size of components in ICs has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP based EUV source a high-power laser pulse is focused on small tin droplets to form highly ionized plasma that emits EUV radiation with a peak maximum emission at 13.5 nm. The intensity of the EUV radiation produced by LPP depends on the effectiveness with which the high-powered laser can produce the plasma from the droplets. Synchronizing the pulses of the high-powered laser with generation and movement of the droplets can improve the efficiency of an LPP based EUV radiation source.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 shows a method for controlling a position of an elongated droplet in z-axis direction, in accordance with some embodiments of the present disclosure.

FIG. 13 shows a method for controlling a position of an elongated droplet in y-axis direction, in accordance with some embodiments of the present disclosure.

FIG. 14 shows a method for controlling a length of an elongated droplet in z-axis direction, in accordance with some embodiments of the present disclosure.

FIG. 15 shows a method for controlling a size of an elongated droplet, in accordance with some embodiments of the present disclosure.

FIG. 17 shows a block diagram of a controller, in accordance with some embodiments of the present disclosure.

DETAILED DESCRIPTION

Figure 1:
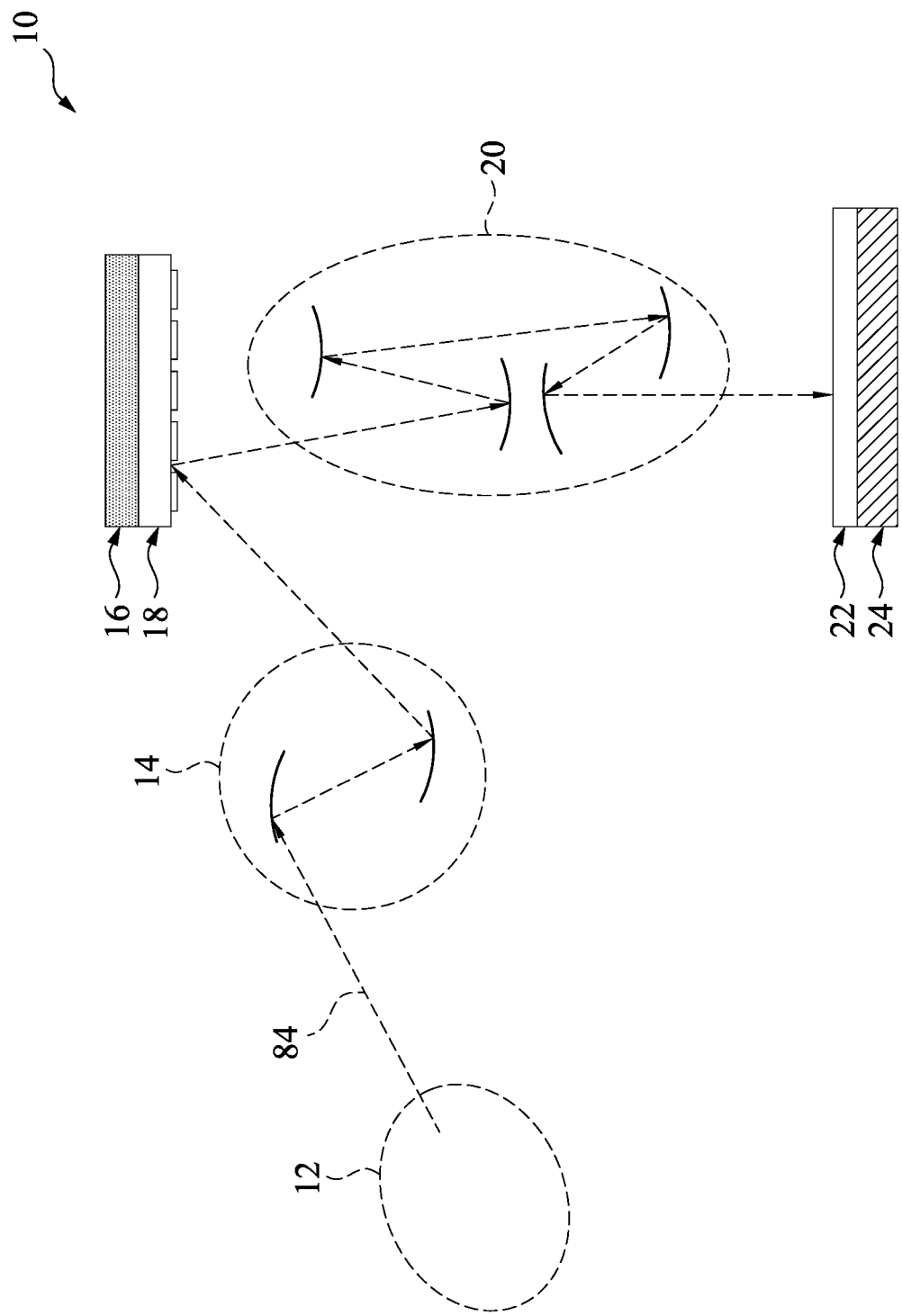
FIG. 1 is a schematic and diagrammatic view of a lithography exposure system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first projection over or on a second projection in the description that follows may include embodiments in which the first and second projections are formed in direct contact, and may also include embodiments in which additional features may be formed between the first and second projections, such that the first and second projections may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is generally related to extreme ultraviolet (EUV) lithography system and methods. More particularly, it is related to apparatuses and methods for controlling droplets used in a laser produced plasma (LPP)-based EUV radiation source. The excitation laser heats droplets in the LPP chamber to ionize the droplets to plasma which emits the EUV radiation. For optimum heating of the droplets, the droplets is arranged to arrive at the focal point of the excitation laser at the same time as an excitation pulse from the excitation laser. Thus, synchronization between the droplets and trigger time for triggering an excitation pulse from the excitation laser contributes to efficiency and stability of the LPP EUV radiation source. One embodiment of the present disclosure is directed to controlling the droplets to provide optimum heating of droplets.

FIG. 1 is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation (also interchangeably referred to herein as EUV radiation). The lithography exposure system 10 includes a light source 12, an illuminator 14, a mask stage 16, a projection optics module (or projection optics box (POB)) 20 and a substrate stage 24, in accordance with some embodiments. The elements of the lithography exposure system 10 can be added to or omitted, and the invention should not be limited by the embodiment.

The light source 12 is configured to generate radians having a wavelength ranging between about 1 nm and about 100 nm in certain embodiments. In one particular example, the light source 12 generates an EUV radiation with a wavelength centered at about 13.5 nm. Accordingly, the light source 12 is also referred to as an EUV radiation source. However, it should be appreciated that the light source 12 should not be limited to emitting EUV radiation. The light source 12 can be utilized to perform any high-intensity photon emission from excited target fuel.

In various embodiments, the illuminator 14 includes various refractive optic components, such as a single lens or a lens system having multiple lenses (zone plates) or alternatively reflective optics (for EUV lithography exposure system), such as a single mirror or a mirror system having multiple mirrors in order to direct light from the light source 12 onto the mask stage 16, particularly to a mask 18 secured on the mask stage 16. In the present embodiment where the light source 12 generates light in the EUV wavelength range, reflective optics is employed.

The mask stage 16 is configured to secure the mask 18. In some embodiments, the mask stage 16 includes an electrostatic chuck (e-chuck) to secure the mask 18. This is because the gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV radiation. The mask 18 may further include a capping layer, such as ruthenium (Ru), disposed on the reflective multilayer for protection. The mask 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming an EUV phase shift mask.

The projection optics module (or projection optics box (POB)) 20 is configured for imaging the pattern of the mask 18 on to a semiconductor wafer 22 secured on the substrate stage 24 of the lithography exposure system 10. In some embodiments, the POB 20 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 20. The illuminator 14 and the POB 20 are collectively referred to as an optical module of the lithography exposure system 10.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV radiation in the present embodiment. Various components including those described above are integrated together and are operable to perform lithography processes.

The lithography exposure system 10 may further include other modules or be integrated with (or be coupled with) other modules. In the present embodiment, the lithography exposure system 10 includes a cleaning module 26 designed to provide hydrogen gas to the light source 12. The hydrogen gas helps reduce contamination in the light source 12.

Figure 2:
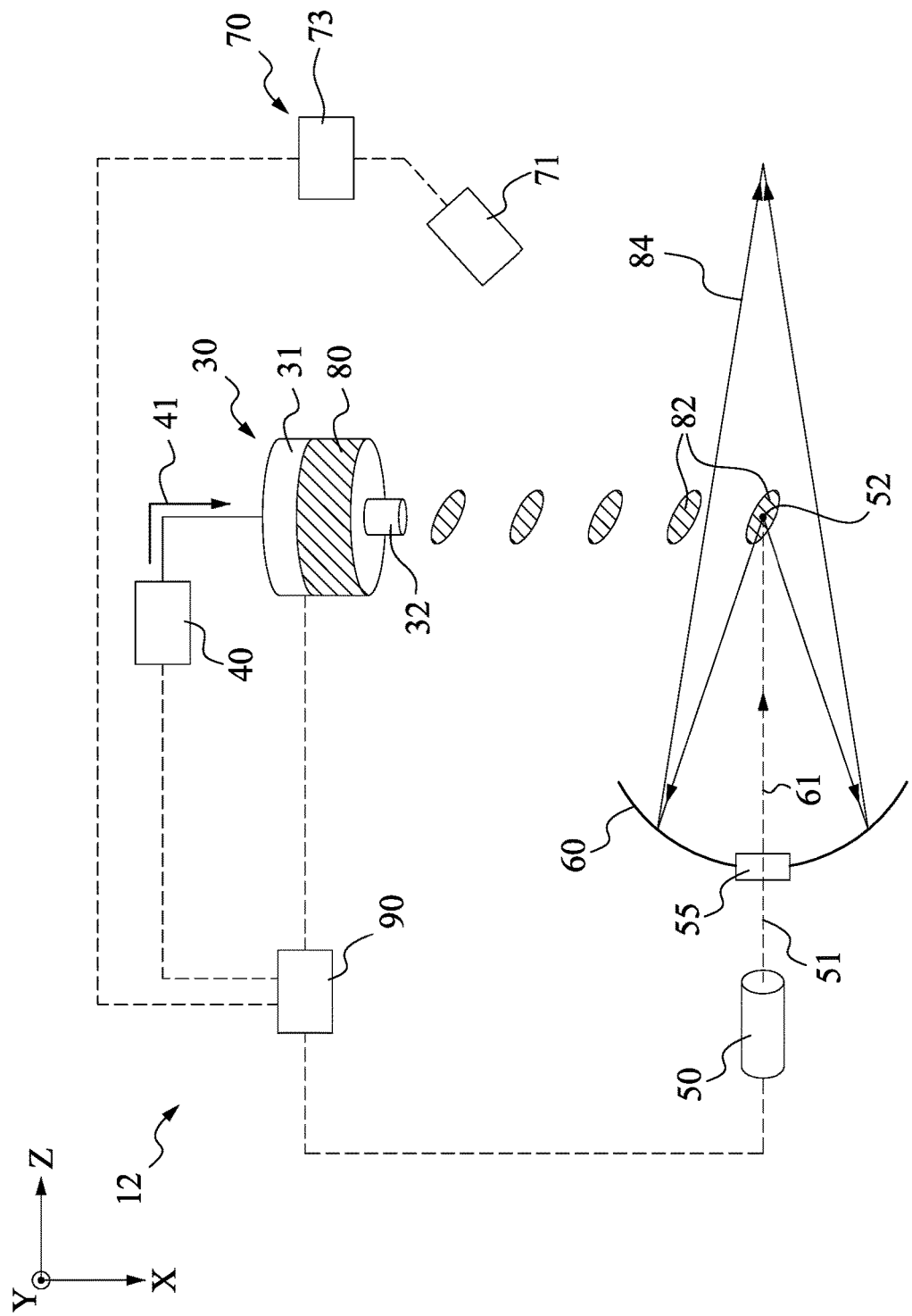
FIG. 2 is a schematic and diagrammatic view of a light source, in accordance with some embodiments.

FIG. 2 illustrates the light source 12 in a diagrammatical view, in accordance with some embodiments. In some embodiments, the light source 12 employs a dual-pulse laser produced plasma (LPP) mechanism to generate plasma and further generate EUV radiation from the plasma. The light source 12 includes a droplet generator 30, a laser generator 50, a laser produced plasma (LPP) collector 60, a monitoring device 70 and a controller 90. The above-mentioned elements of the light source 12 may be held under vacuum. It should be appreciated that the elements of the light source 12 can be added to or omitted, and the invention should not be limited by the embodiment.

The droplet generator 30 is configured to generate a plurality of elongated droplets 82 of a target fuel 80 to a zone of excitation at which a laser pulse 51 from the laser generator 50 hit the elongated droplets 82 along a z-axis, as shown in FIG. 2. In an embodiment, the target fuel 80 includes tin (Sn). In an embodiment, the elongated droplets 82 may be formed with a football like shape. In an embodiment, the elongated droplets 82 are generated at a rate about 50 kilohertz (kHz) and are introduced into the zone of excitation 81 in the light source 12 at a speed about 70 meters per second (m/s). Other material can also be used for the target fuel 80, for example, a tin containing liquid material such as eutectic alloy containing tin, lithium (Li), and xenon (Xe). The target fuel 80 receiving in the droplet generator 30 may be in a liquid phase. The structural features of the droplet generator 30 will be described in more details in relation to FIGS. 3 and 4.

The laser generator 50 is configured to generate at least one laser to allow the conversion of the elongated droplets 82 into plasma. In some embodiments, the laser generator 50 is configured to produce a laser pulse 51 to the lighting point 52 to convert the elongated droplets 82 to plasma which generates EUV radiation 84. The laser pulse 51 is directed through window (or lens) 55, and irradiate elongated droplets 82 at the lighting point 52. The window 55 is formed on the collector mirror 60 and adopts a suitable material substantially transparent to the laser pulse 51. The method for exciting the elongated droplets 82 supplied by the droplet generator 30 is described later. The plasma emits EUV radiation 84, which is collected by the collector mirror 60. The collector mirror 60 further reflects and focuses the EUV radiation 84 for the lithography processes performed through an exposure tool. In some embodiments, the collector mirror 60 has an optical axis 61 which is parallel to the z-axis and perpendicular to the x-axis.

In an embodiment, the laser generator 50 is a carbon dioxide ($CO_2$) laser source. In some embodiments, the laser generator 50 is used to generate the laser pulse 51 with single wave length. The laser pulse 51 is transmitted through an optic assembly for focusing and determining incident angle of the laser pulse 51. The optic assembly is free of splitter to separate laser pulses with different wave lengths. In the present embodiment, the laser pulse 51 has a spot size about 200-300 μm, such as 225 μm. The laser pulse 51 is generated to have certain driving powers to meet wafer production targets, such as a throughput of 125 wafers per hour. For example, the laser pulse 51 is equipped with about 23 kW driving power. In various embodiments, the driving power of the laser pulse 51 is at least 20 kW, such as 27 kW. However, it should be appreciated that many variations and modifications can be made to embodiments of the disclosure.

The monitoring device 12 is configured to monitor one or more conditions in the light source 12 so as to produce data for controlling configurable parameters of the light source 12. In some embodiments, the monitoring device 70 includes a metrology tool 71 and an analyzer 73. In cases where the metrology tool 71 is configured to monitor condition of the elongated droplets 82 supplied by the droplet generator 30, the metrology tool may include an image sensor, such as charge coupled device, CCD or complementary metal oxide semiconductor sensor, CMOS sensor, etc. The metrology tool 71 produces a monitoring image including image or video of the elongated droplets 82 and transmits the monitoring image to the analyzer 73. In cases where the metrology tool 71 is configured to detect energy or intensity of the EVU light 84 produced by the elongated droplet 82 in the light source 12, the meteorology tool 71 may include a number of energy sensors. The energy sensors may be any suitable sensors that are able to observe and measure energy of electromagnetic radiation in the ultraviolet region.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image-analysis process on the images of the elongated droplets 82 in the excitation zone 81. Afterwards, the analyzer 73 sends data related to the analysis to the controller 90. The analysis may include a flow path error or a position error.

It will be appreciated that, while there is only one metrology tool 71 arranged for monitoring the elongated droplets 82, many variations and modifications can be made to embodiments of the disclosure. In some other embodiments, there are two metrology tools 71 used to monitor different conditions of the light source 12. One is configured to monitor condition of the elongated droplets 82 supplied by the droplet generator 30, and the other is configured to detect energy or intensity of the EUV light 84 produced by the elongated droplet 82 in the light source 12. In some embodiments, the metrology tool 71 is a final focus module (FFM) and positioned in the laser source 50 to detect light reflected from the elongated droplet 82.

The controller 90 is configured to control one or more elements of the light source 12. In some embodiments, the controller 90 is configured to drive the droplet generator 30 to generate the elongated droplets 82 (a process that will be described in more detail in relation to the method S10 shown in FIG. 6). In addition, the controller 90 is configured to drive the first laser source 91 and the laser generator 50 to fire the laser pulse 51. The generation of the laser pulse 51 may be controlled to be associated with the generation of elongated droplets 82 by the controller 90 so as to make the laser pulse 51 hit each target 82 in sequences.

The droplet generator 30, in accordance with some embodiments, is discussed further below.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31.

Figure 3:
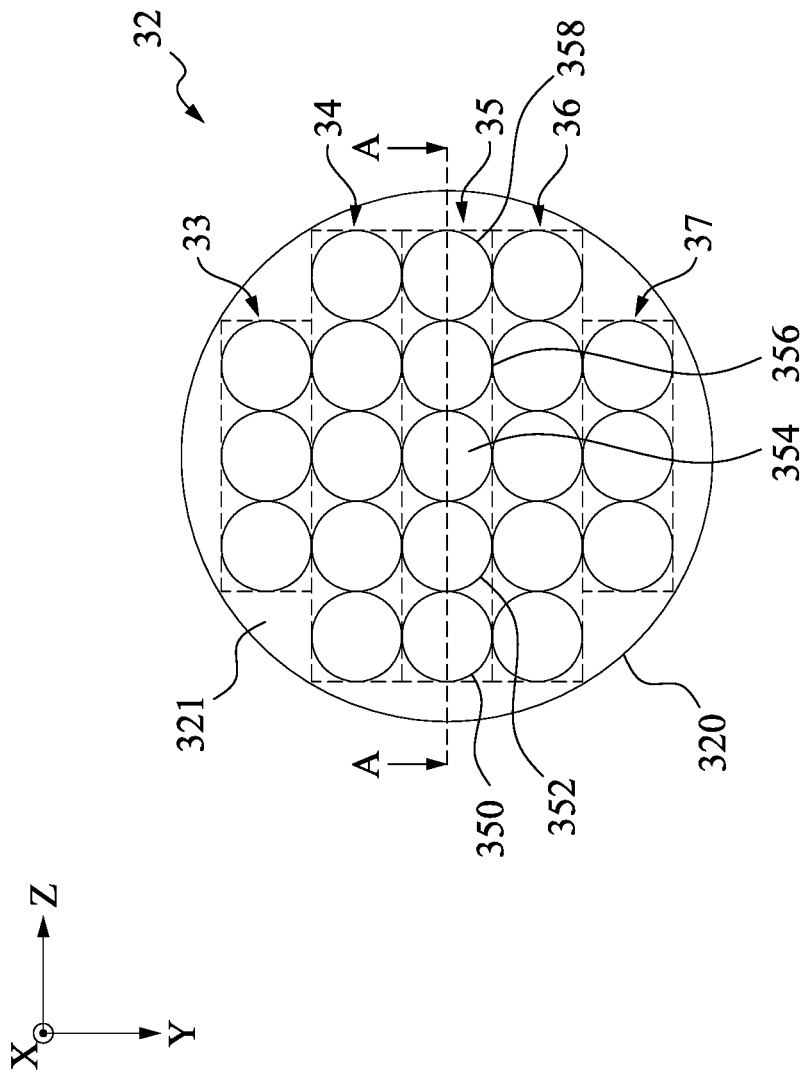
FIG. 3 is a schematic and diagrammatic view of a nozzle assembly, in accordance with some embodiments.
Figure 4:
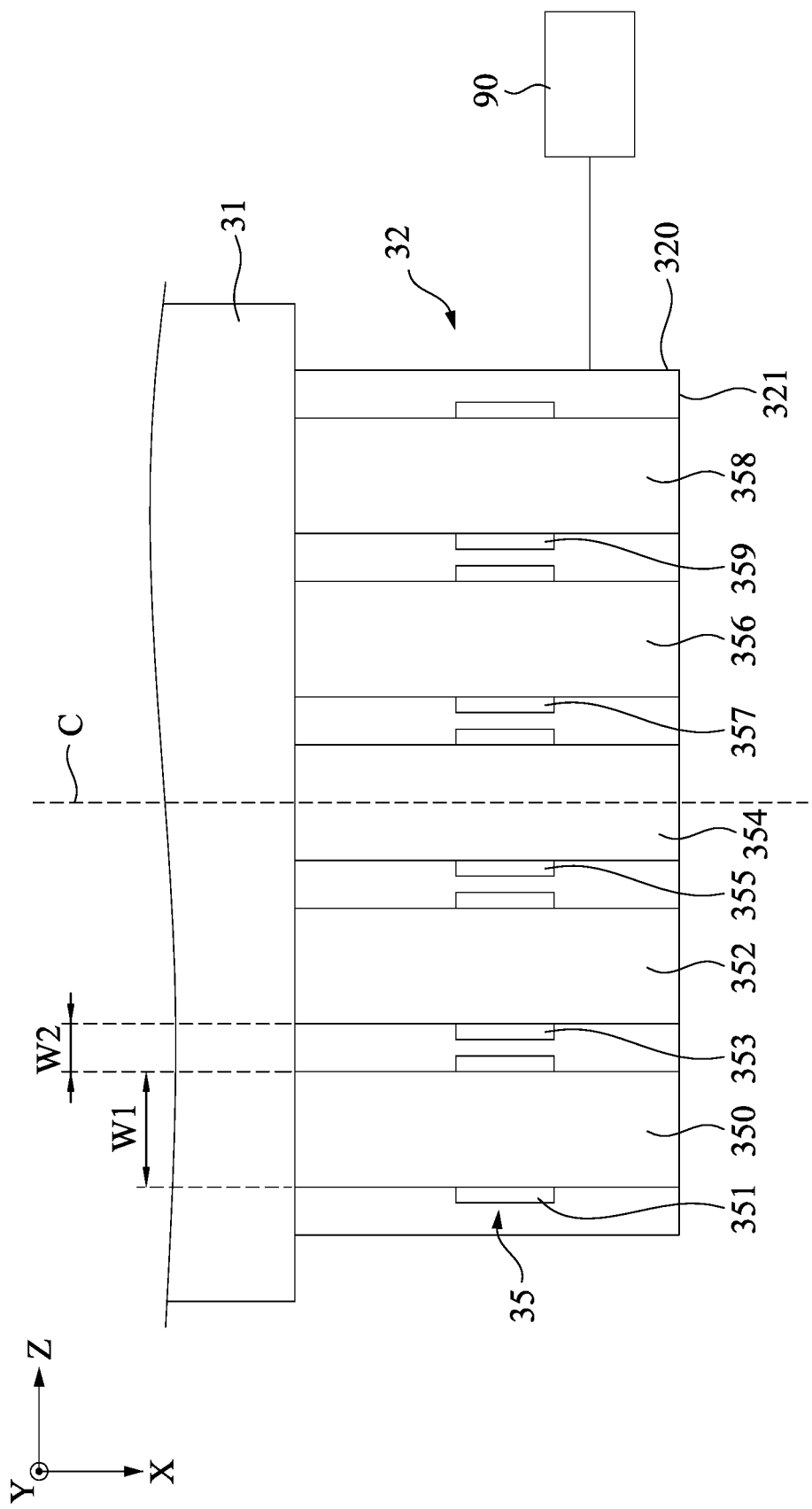
FIG. 4 is a schematic and cross-sectional view of the nozzle assembly taken along line A-A of FIG. 3.

The nozzle assembly 32 includes a number of nozzles through which target material 80 escapes to form a number of small drops of the target material 80. One exemplary embodiment of the nozzle assembly 32 is shown in FIG. 3, and FIG. 4 shows a cross-sectional view of the nozzle assembly 32 taken along line A-A of FIG. 3. In some embodiments, the nozzle assembly 32 includes a housing 320 and multiple groups of nozzles, such as first group of nozzles 33, second group of nozzles 34, third group of nozzles 35, fourth group of nozzles 36 and fifth group of nozzles 37, positioned in the housing 320. The first group of nozzles 33, the second group of nozzles 34, the third group of nozzles 35, the fourth group of nozzles 36 and the fifth group of nozzles 37 are arranged in order along a y-axis which is perpendicular to the x-axis and the z-axis.

In some embodiments, nozzles in each of the first group of nozzles 33, the second group of nozzles 34, the third group of nozzles 35, the fourth group of nozzles 36 and the fifth group of nozzles 37 are arranged along the z-axis. For example, as shown in FIG. 3, the third group of nozzles 35 includes five nozzles (i.e., first nozzle 350, second nozzle 352, third nozzle 354, fourth nozzle 356 and fifth nozzle 358). The first nozzle 350, the second nozzle 352, the third nozzle 354, the fourth nozzle 356 and the fifth nozzle 358 are arranged along the z-axis. In addition, nozzles in each of the first group of nozzles 33, the second group of nozzles 34, the third group of nozzles 35, the fourth group of nozzles 36 and the fifth group of nozzles 37 extend along a direction that is parallel to the a central line C of the nozzle assembly 32 and terminate at a lower surface 321 of the housing 320. The central line C is parallel to the x-axis, and the lower surface 321 is perpendicular to the x-axis.

In some embodiments, the nozzles in each of the first group of nozzles 33, the second group of nozzles 34, the third group of nozzles 35, the fourth group of nozzles 36 and the fifth group of nozzles 37 are arranged side by side in a compact fashion. The compact fashion means a distance between two neighboring nozzles is less than a predetermined value. For example, as shown in FIG. 4, the first nozzle 350, the second nozzle 352, the third nozzle 354, the fourth nozzle 356 and the fifth nozzle 358 are arranged in the compact fashion, and a distance W2 between two neighboring nozzles 350 and 352 is less than a width W1 of the nozzle 350. In some embodiments, the distance W2 is smaller enough for facilitating an aggregation of the small drops of the target material. A ratio of the distance W2 to the width W1 may be selected such that the small drops of the target material can be aggregated to the elongated droplet. In some embodiments, the ratio of the distance W2 to the width W1 is in a range from about 0 to about 1. In some embodiments, in addition to the nozzles in the same group are arranged in the compact fashion, nozzles in different groups of nozzles and arranged along the y-axis direction are arranged in the compact fashion. For example, as shown in FIG. 3, nozzles in the second group of nozzles 34 and nozzles in third group of nozzles 35 are arranged in the compact fashion along a direction that is parallel to the y-axis.

In some embodiments, the flows of the target material in the nozzles in the first group of nozzles 33, the second group of nozzles 34, the third group of nozzles 35, the fourth group of nozzles 36 and the fifth group of nozzles 37 are regulated by actuators connected to the nozzles. For example, as shown in FIG. 4, the nozzle assembly 32 includes a number of actuators, such as first actuator 351, second actuator 353, third actuator 355, fourth actuator 357 and fifth actuator 359. The first actuator 351, the second actuator 353, the third actuator 355, the fourth actuator 357 and the fifth actuator 359 are respectively connected to outer walls of the first nozzle 350, the second nozzle 352, the third nozzle 354, the fourth nozzle 356 and the fifth nozzle 358. In some embodiments, the first nozzle 350, the second nozzle 352, the third nozzle 354, the fourth nozzle 356 and the fifth nozzle 358 are electrically connected to the controller 90 and control the flow of the target material according to control signals transmitted from the controller 90.

The first actuator 351, the second actuator 353, the third actuator 355, the fourth actuator 357 and the fifth actuator 359 can be any suitable device that is able to control the flow of the target material in the nozzles, as long as the actuators undergo a dimensional change when subjected to a voltage, electric field, magnetic field, or combinations thereof. For example, the first actuator 351, the second actuator 353, the third actuator 355, the fourth actuator 357 and the fifth actuator 359 are piezoelectric actuators and are able to squeeze the corresponding nozzles and generate small drops of target material through orifices formed on the lower surface 321 of the housing 320. Other exemplary material of the actuators includes electrostrictive materials and magnetostrictive materials, for example.

It will be appreciated that the configuration of the nozzle assembly 32 is not limited to the above-mentioned embodiments. Various embodiments of the nozzle assembly are shown in FIGS. 5A-5D. In the embodiments shown in FIGS. 5A-5D, elements that are similar to those shown in FIGS. 3 and 4 are provided with the same or similar reference numbers, and the features thereof are not reiterated in the interests of brevity. The discussion of nozzles 351-355 applies to nozzles in different group of nozzles shown in FIGS. 5A-5D unless mentioned otherwise.

Figure 5B:
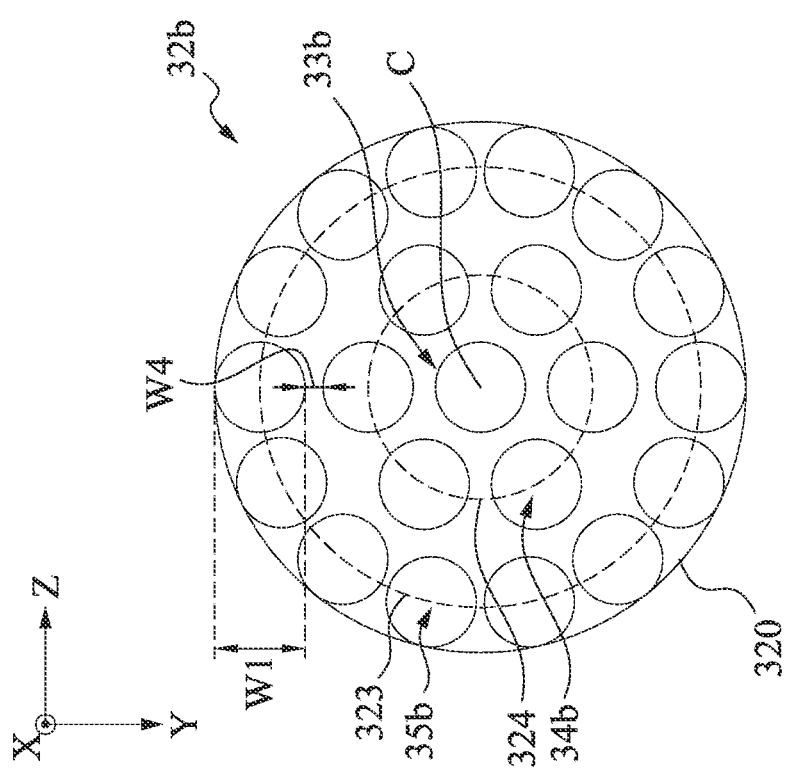
FIG. 5B is a schematic and diagrammatic view of a nozzle assembly, in accordance with some embodiments.
Figure 5A:
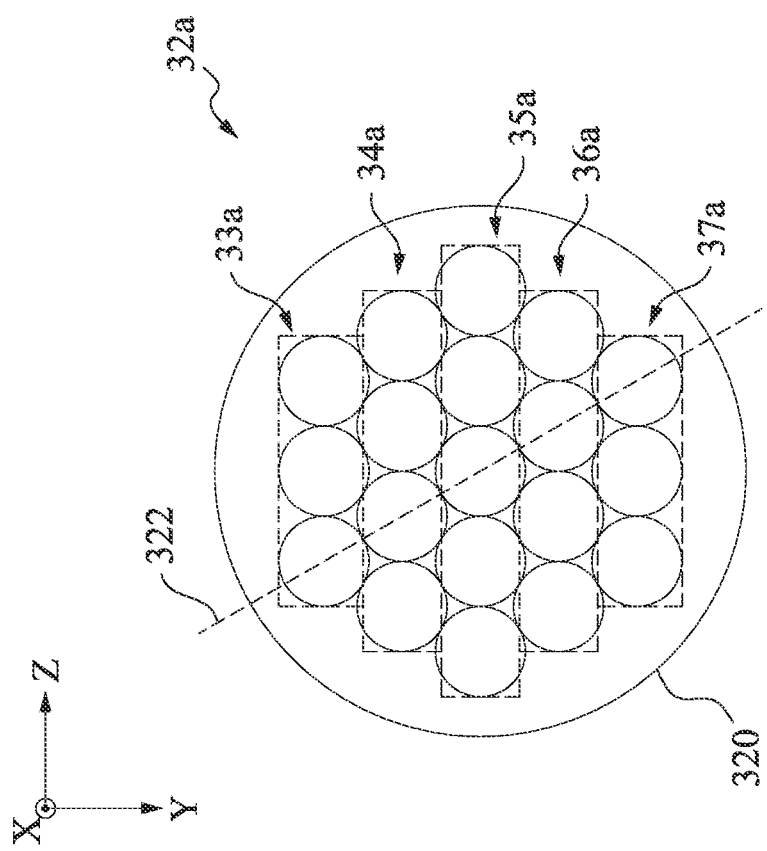
FIG. 5A is a schematic and diagrammatic view of a nozzle assembly, in accordance with some embodiments.

In the embodiment shown in FIG. 5A, the nozzle assembly 32a includes the housing 320 and multiple groups of nozzles, such as first group of nozzles 33a, second group of nozzles 34a, third group of nozzles 35a, fourth group of nozzles 36a and fifth group of nozzles 37a, positioned in the housing 320. The first group of nozzles 33a, the second group of nozzles 34a, the third group of nozzles 35a, the fourth group of nozzles 36a and the fifth group of nozzles 37a are arranged in order along the y-axis. The nozzles in two adjacent groups of nozzles are arranged in a staggered manner, so that the nozzles in two adjacent groups of nozzles which are arranged in an askew line 322 are arranged side by side in a compact fashion. The askew line 322 is inclined relative to the z-axis by about 45 degrees.

In the embodiment shown in FIG. 5B, the nozzle assembly 32b includes the housing 320, multiple groups of nozzles, first group of nozzles 34b and second group of nozzles 35b, positioned in the housing 320, and a central nozzle 33b. The central nozzle 33b is positioned relative to the center line C of the housing 320. The first group of nozzles 34b is arranged along a circular line 324, and the second group of nozzles 35b is arranged along a circular line 323. The circular line 324 and the circular line 323 are concentric relative to the center line C of the housing 320.

In some embodiments, nozzles in two groups of nozzles that are next to each other are arranged in an expanded fashion. The expanded fashion mean a distance between two neighboring nozzles is less than a predetermined value. For example, as shown in FIG. 5B, the nozzle in the first group of nozzles 34b and the nozzle in the second group of nozzles 35b are arranged in the expanded fashion, and a distance W4 between two neighboring nozzles is less than a width W1 of each individual nozzle. In some embodiments, the distance W4 is smaller enough for facilitating an aggregation of the small drops of the target material. A ratio of the distance W4 to the width W1 may be selected such that the small drops of the target material can be aggregated to the elongated droplet. In some embodiments, the ratio of the distance W4 to the width of W1 is in a range from about 0.2 to about 1. In some embodiments, the nozzles in the same group of nozzles are arranged in the expanded fashion as well.

Figure 5D:
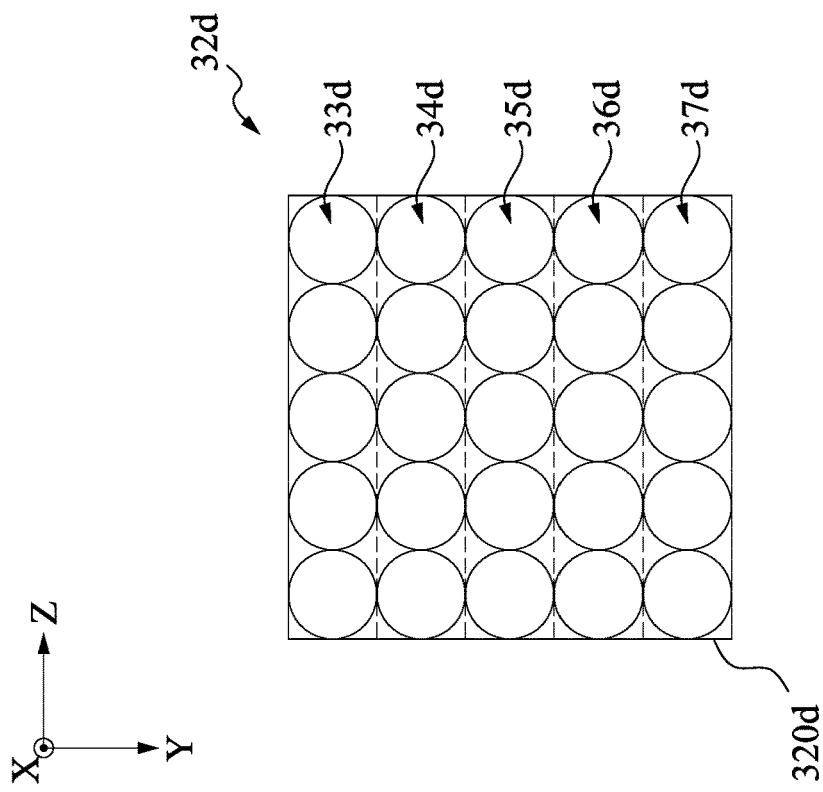
FIG. 5D is a schematic and diagrammatic view of a nozzle assembly, in accordance with some embodiments.
Figure 5C:
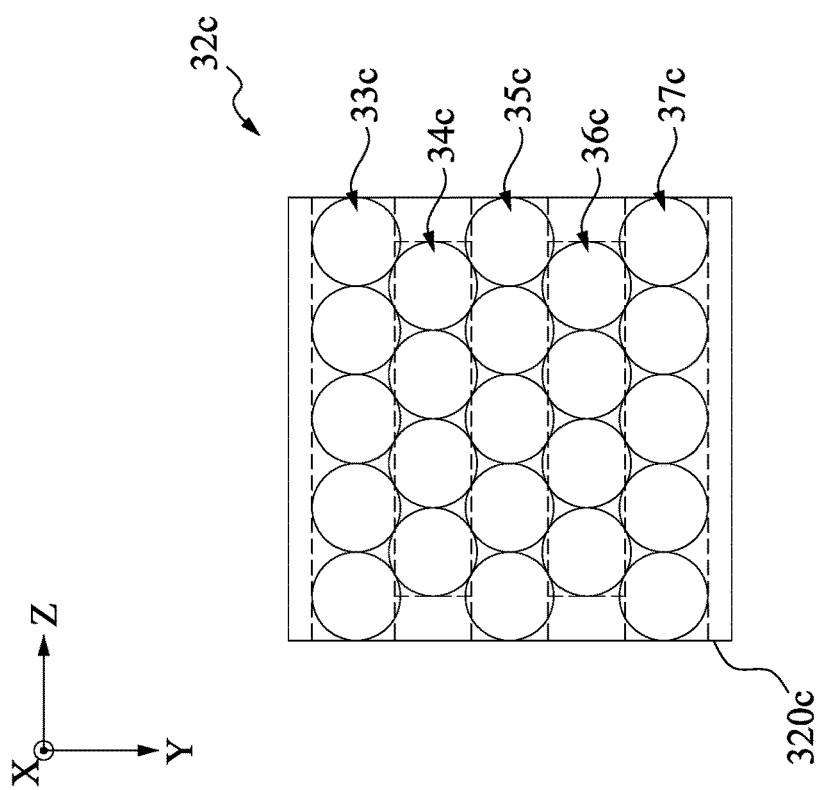
FIG. 5C is a schematic and diagrammatic view of a nozzle assembly, in accordance with some embodiments.

In the embodiment shown in FIG. 5C, the nozzle assembly 32c includes the housing 320c and multiple groups of nozzles, such as first group of nozzles 33c, second group of nozzles 34c, third group of nozzles 35c, fourth group of nozzles 36c and fifth group of nozzles 37c, positioned in the housing 320c. The housing 320c has a rectangular cross-section. The first group of nozzles 33c, the second group of nozzles 34c, the third group of nozzles 35c, the fourth group of nozzles 36c and the fifth group of nozzles 37c are arranged in order along the y-axis. The nozzles in two adjacent groups of nozzles are arranged in a staggered manner. The number of the nozzles in each group of nozzles is the same.

In the embodiment shown in FIG. 5D, the nozzle assembly 32d includes the housing 320d and multiple groups of nozzles, such as first group of nozzles 33d, second group of nozzles 34d, third group of nozzles 35d, fourth group of nozzles 36d and fifth group of nozzles 37d, positioned in the housing 320d. The housing 320d has a rectangular cross-section. The first group of nozzles 33d, the second group of nozzles 34d, the third group of nozzles 35d, the fourth group of nozzles 36d and the fifth group of nozzles 37d are arranged in a square array.

Figure 6:
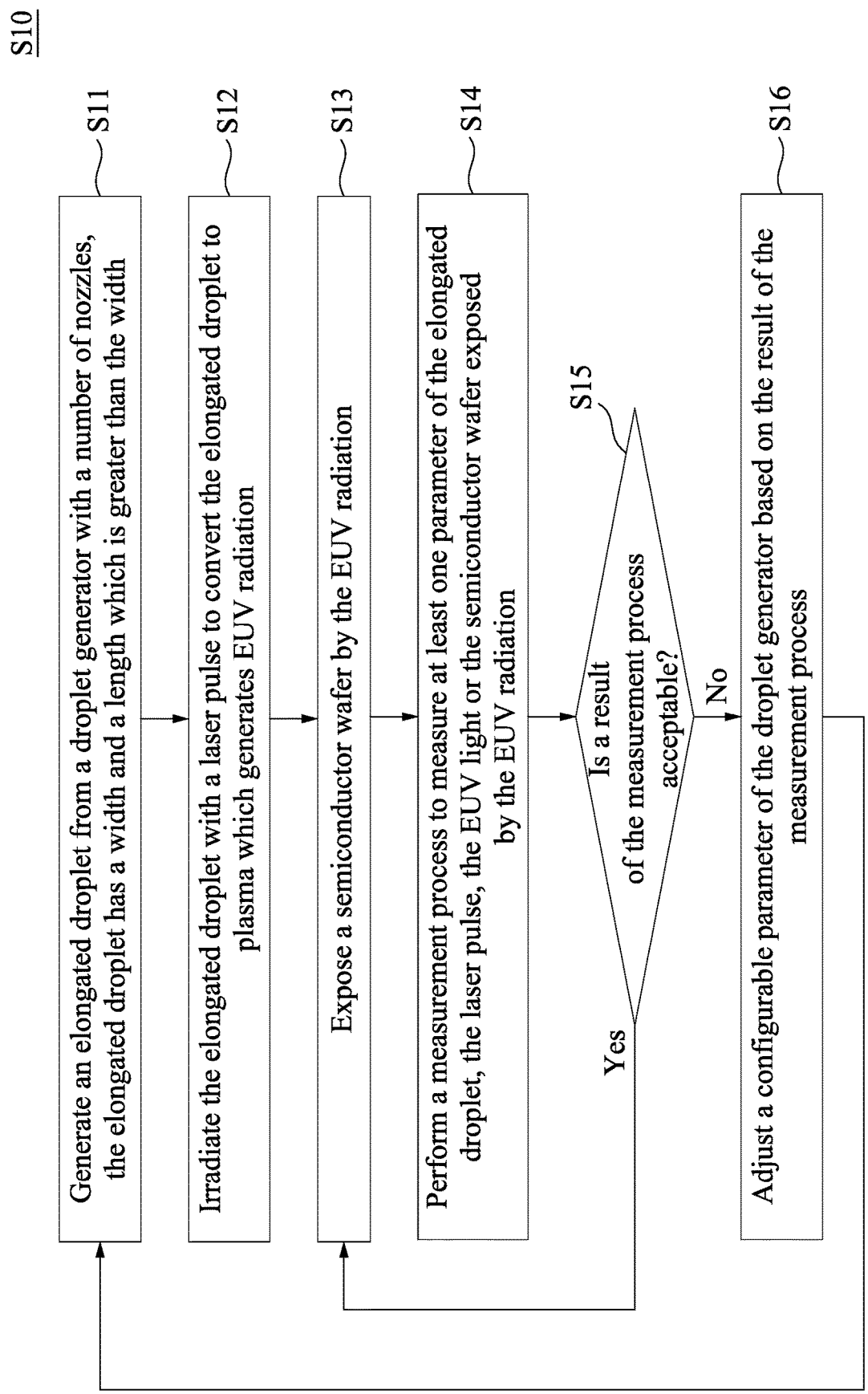
FIG. 6 is a flow chart of a method for performing a lithography process in semiconductor fabrication, in accordance with some embodiments of the present disclosure.

FIG. 6 is a flow chart of a method S10 for performing a lithography process in semiconductor fabrication, in accordance with some embodiments of the present disclosure. Although the method S10 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations.

Figure 7:
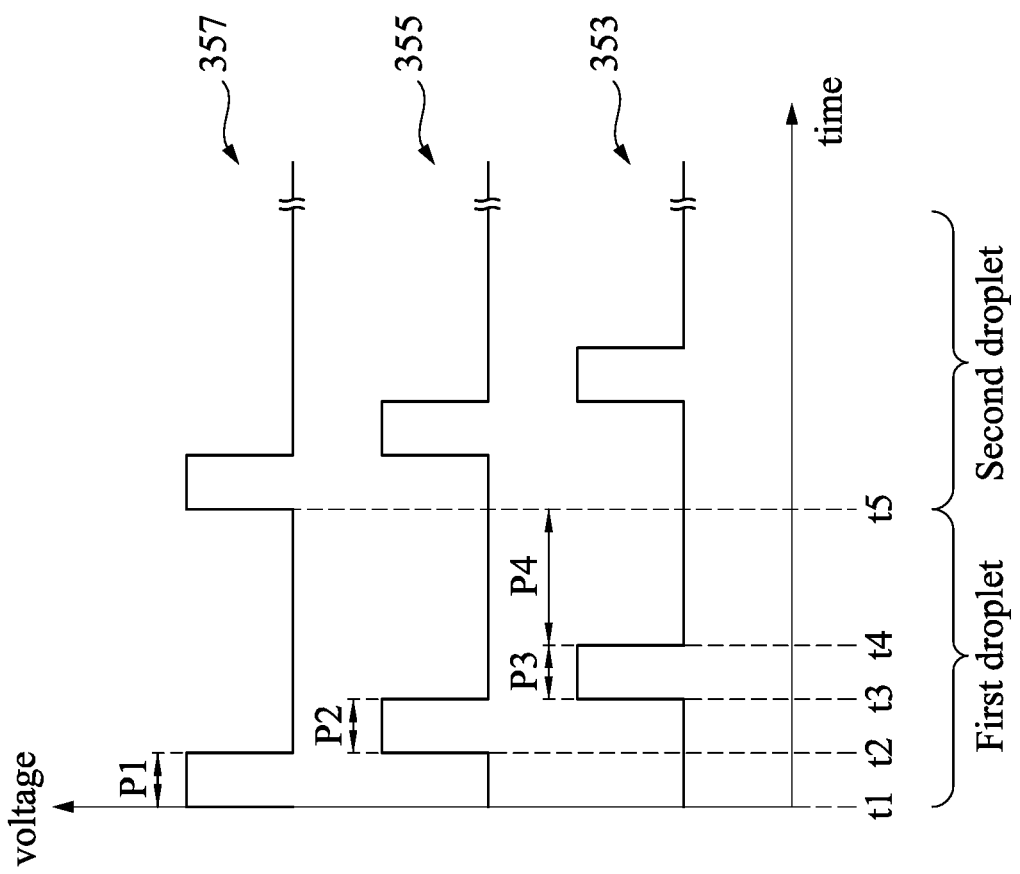
FIG. 7 is a graph of voltage applied to actuators connected to different nozzles versus time in a lithography process, in accordance with some embodiments.

The method S10 includes operation S11, in which an elongated droplet 82 is generated from the nozzles of the droplet generator 30. In some embodiments, the elongated droplet 82 is aggregated by a group of small drops provided by different nozzles, and at least one small drop in the group of small drops is provided at different time from the remaining small drop in the same group. FIG. 7 shows a graph of voltage applied to the actuators connected to different nozzles versus time in a lithography process, in accordance with some embodiments. As shown in FIG. 7, to form droplets, the controller 90 (FIG. 2) may repeatedly apply an actuating voltage to the actuator 357 at time t1 for a period of time P1, apply another actuating voltage to the actuator 355 at time t2 for a period of time P2, and apply the other actuating voltage to the actuator 355 at time t3 for a period of time P3.

Figure 8:
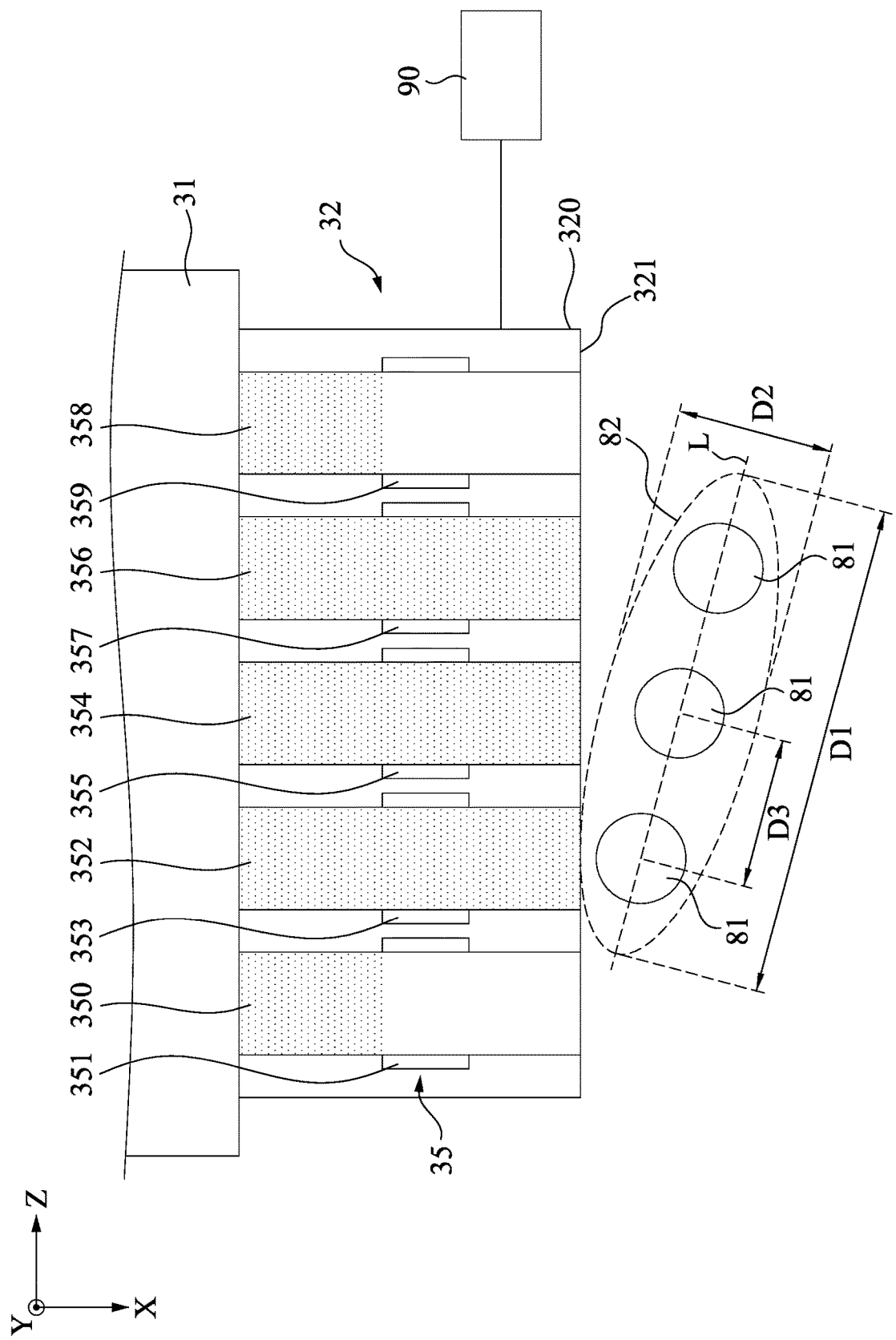
FIG. 8 shows a stage of a lithography method in semiconductor fabrication, in which an elongate droplet is generated by a group of small drops provided by three consecutively arranged nozzles, in accordance with some embodiments.

As a result, as shown in FIG. 8, three small drops 81 of the target material are generated from the nozzle 352, the nozzle 354 and the nozzle 356. In some embodiments, the three small drops 81 of the target material are attracted each other by Van der waals force or surface tension of liquid and aggregate to form the elongated droplet 82. The elongated droplet 82 extends along its longitudinal axis L and has a length D1 in the longitudinal axis L and a width D2 in a direction perpendicular to the longitudinal axis L. In accordance with an aspect of the present disclosure, a ratio of the length D1 to the width D2 is greater than 1. In some embodiments, a ratio of the length D1 to the width D2 is in a range from about 50 um to about 5 um.

In some embodiments, since the three small drops 81 of the target material are generated at different times, the small drops 81 of the target material are spaced away from the lower surface 321 of the housing 320 by different distances. Therefore, the longitudinal axis L of the elongated droplet 82 is oblique with the x-axis. In some embodiments, the longitudinal axis L of the elongated droplet 82 is oblique with the x-axis by an angle range from about 90 degrees to about 0 degree. For example, in an embodiment, the longitudinal axis L of the elongated droplet 82 is oblique with the x-axis by about 75 degrees, about 60 degrees, about 45 degrees, about 30 degrees, about 15 degrees, about 5 degrees, or at any degrees between these values.

In some embodiments, the tilt angle of the elongate droplet 82 relative to the x-axis may be regulated by controlling the times at which each of the small drops are generated from the nozzle. The detailed description for controlling x-axis tilt angle is described as follows. In the embodiment shown in FIG. 7, the actuator 357 is driven to generate a small drop of target material for a time period P1, the actuator 355 is driven to generate a small drop of target material for a time period P2, and the actuator 353 is driven to generate a small drop of target material for a time period P3. The time period P1 equals to a time differences between the time t1 and time t2, the time period P2 equals to a time differences between the time t2 and time t3. That is, the small drops from different nozzles are generated consecutively.

To decrease a tilt angle of the elongated droplet 82 relative to the x-axis, a time interval may be programmed between the generations of two the small drops of the target material. Specifically, the time t2 for generating second small drop may be delayed, so that the time differences between the time t1 and time t2 is longer than the time period P1, and the time t3 for generating third small drop may be delayed, so that the time differences between the time t2 and time t3 is longer than the time period P2. As such, a distance between the first small drop and the lower surface 321 and a distance between the second small drop and the lower surface 321 are increased, which results in a decrease of a tilt angle between the longitudinal axis L of the elongated droplet 82 and the x-axis.

To increase a tilt angle of the elongated droplet 82 relative to the x-axis, the time period for generations of two the small drops of the target material may be overlapped. Specifically, the time t2 for generating second small drop may be begun earlier, so that the time differences between the time t1 and time t2 is shorter than the time period P1, and the time t3 for generating third small drop may be begun earlier, so that the time differences between the time t2 and time t3 is shorter than the time period P3. As such, a distance between the first small drop and the lower surface 321 and a distance between the second small drop and the lower surface 321 are decreased in comparison with the elongated droplet 82 shown in FIG. 8, which results in an increase of a tilt angle between the longitudinal axis L of the elongated droplet 82 and the x-axis.

In some embodiments, the last small drop in a group of small drops for aggregating a first elongated droplet is ended at time t4, and the first small drop in a group of small drops for aggregating a next elongated droplet is started at time t5. A time period P4 between time t4 and time t5 can be any suitable value as long as the last small drop for aggregation of the first elongated droplet does not aggregated with the first drop for aggregation of the next elongated droplet. In the other words, the delay (i.e., the sum of time periods P1-P4) between elongated droplets is longer than the delay (i.e., time period P4) between drops for aggregation of the elongated droplet. For example, in the cases where fifty (50) elongated droplets are generated per second, the sum of time periods P1-P4 is 0.02 seconds, and the time period P4 is less than 0.02 seconds. For example, in an embodiment, the time period P4 is about 0.015 seconds, about 0.01 seconds, about 0.005 seconds or any time period between these values.

In some embodiments, the small drops 81 are generated from the droplet generator 30 along the x-axis. In some embodiments, the small drops 81 are tin (Sn), lithium (Li), or an alloy of Sn and Li. In some embodiments, the small drops 81 each have a diameter in a range from about 2 microns (µm) to about 3 µm. For example, in an embodiment, the small drops 81 are tin liquid, each having a diameter of about 2.5 µm, or any diameter between these values. In some embodiments, the small drops 81 are supplied through the nozzles at a rate in a range from about 50 droplets per second (i.e., an ejection-frequency of about 50 Hz) to about 50,000 droplets per second (i.e., an ejection-frequency of about 50 kHz). The term "small" in this disclosure refers to a size of a drop of the target material that is not sufficient for generating enough EUV radiation for the lithography process after being subjected to the laser pulse 51.

For example, in an embodiment, small drops 81 are supplied at an ejection-frequency of about 50 Hz, about 100 Hz, about 500 Hz, about 1 kHz, about 10 kHz, about 25 kHz, about 50 kHz, or any ejection-frequency between these frequencies. The small drops 81 are ejected through the nozzle 117 and aggregate into the elongated droplet 82. The elongated droplet 82 may be transmitted to lighting point 52 at a speed in a range from about 10 meters per second (m/s) to about 100 m/s in various embodiments. For example, in an embodiment, the small drops 81 have a speed of about 10 m/s, about 25 m/s, about 50 m/s, about 75 m/s, about 100 m/s, or at any speed between these speeds.

It will be appreciated that while in the embodiment shown in FIG. 8, three neighboring nozzles 352, 354 and 357 are used to provide the small drops 81 of the target material, the disclosure is not limited thereto, and any number of nozzles can be selected to provide the small drops 81 of the target material and the small drops can be produced by nozzles that are not adjacent to each other.

Figure 9:
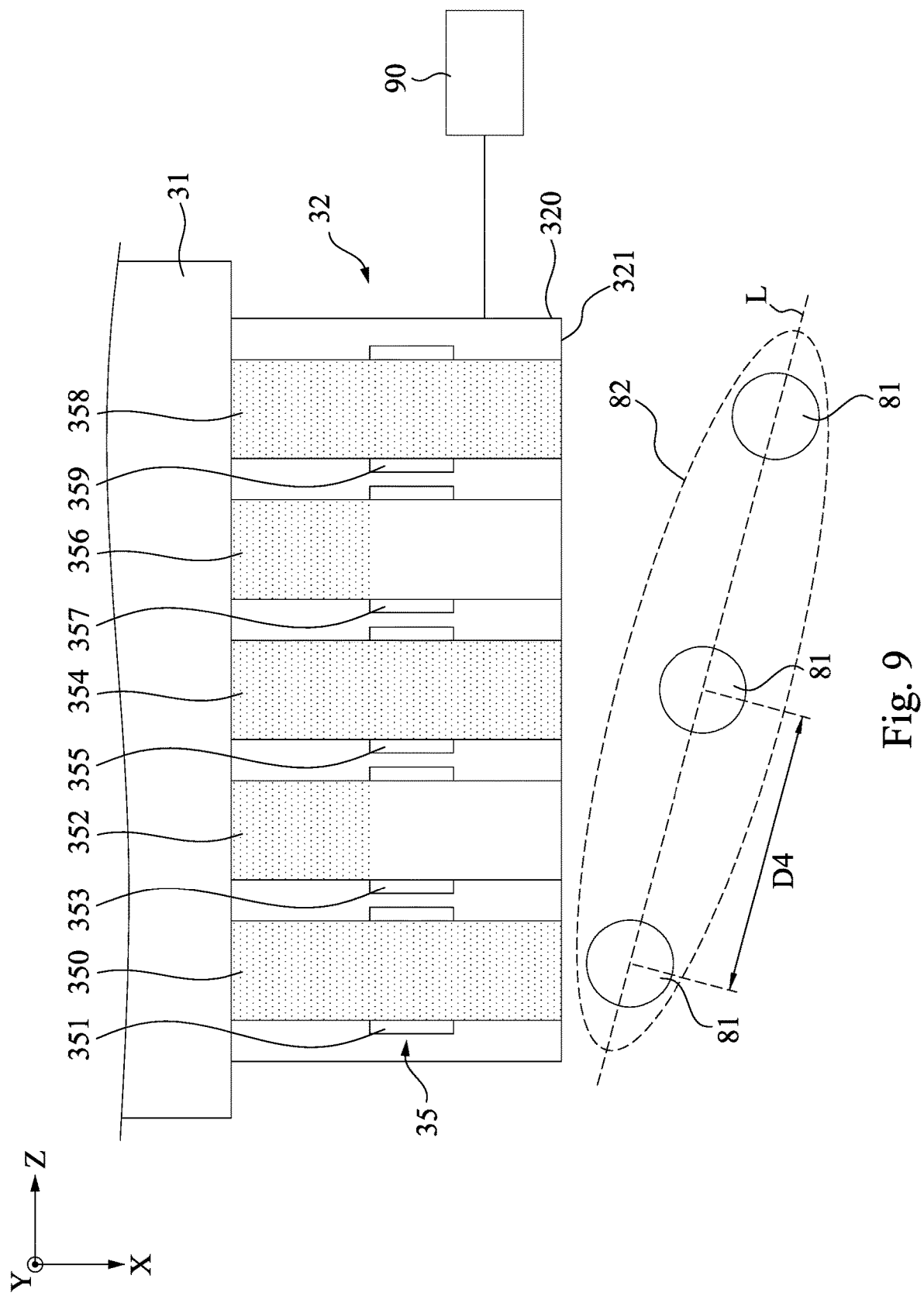
FIG. 9 shows a stage of a lithography method in semiconductor fabrication, in which an elongate droplet is generated by a group of small drops provided by three nozzles spaced apart from one another by one shut off nozzle, in accordance with some embodiments.

For example, as shown in FIG. 9, the nozzles 350, 354 and 358 are actuated to generate the small drops 81 of the target material, and the nozzles 352 and 356 are shut off. Therefore, a distance D4 between two neighboring small drops 81 shown in FIG. 9 is greater than a distance D3 between two neighboring small drops 81 shown in FIG. 8. That is, the elongated droplet 82 in FIG. 9 has a lower density than the elongated droplet 82 shown in FIG. 8. Since the elongated droplet 82 in FIG. 9 has a lower density than the elongated droplet 82 shown in FIG. 8, most of the target material 80 in the elongated droplet 82 in FIG. 9 would be irradiated by the laser pulse 51 from the laser generator 50 thereby resulting in higher energy conversion efficiency in comparison to the elongated droplet 82 shown in FIG. 8.

In some embodiments, the nozzles 350, 354 and 358 are actuated to generate the small drops 81 of the target material having a unit quantity, and the nozzles 352 and 356 are actuated to generate the small drops 81 of the target material having less than the unit quantity (e.g., 50% of the unit quantity), for example, by actuating less power to the actuators 353 and 357. The small drops 81 of the target material has less than the quantity may facilitate the aggregation of the small drops 81 to form the elongated droplet 82 and in the meantime may exhibit higher energy conversion efficiency in comparison to the elongated droplet 82 shown in FIG. 8.

Figure 10:
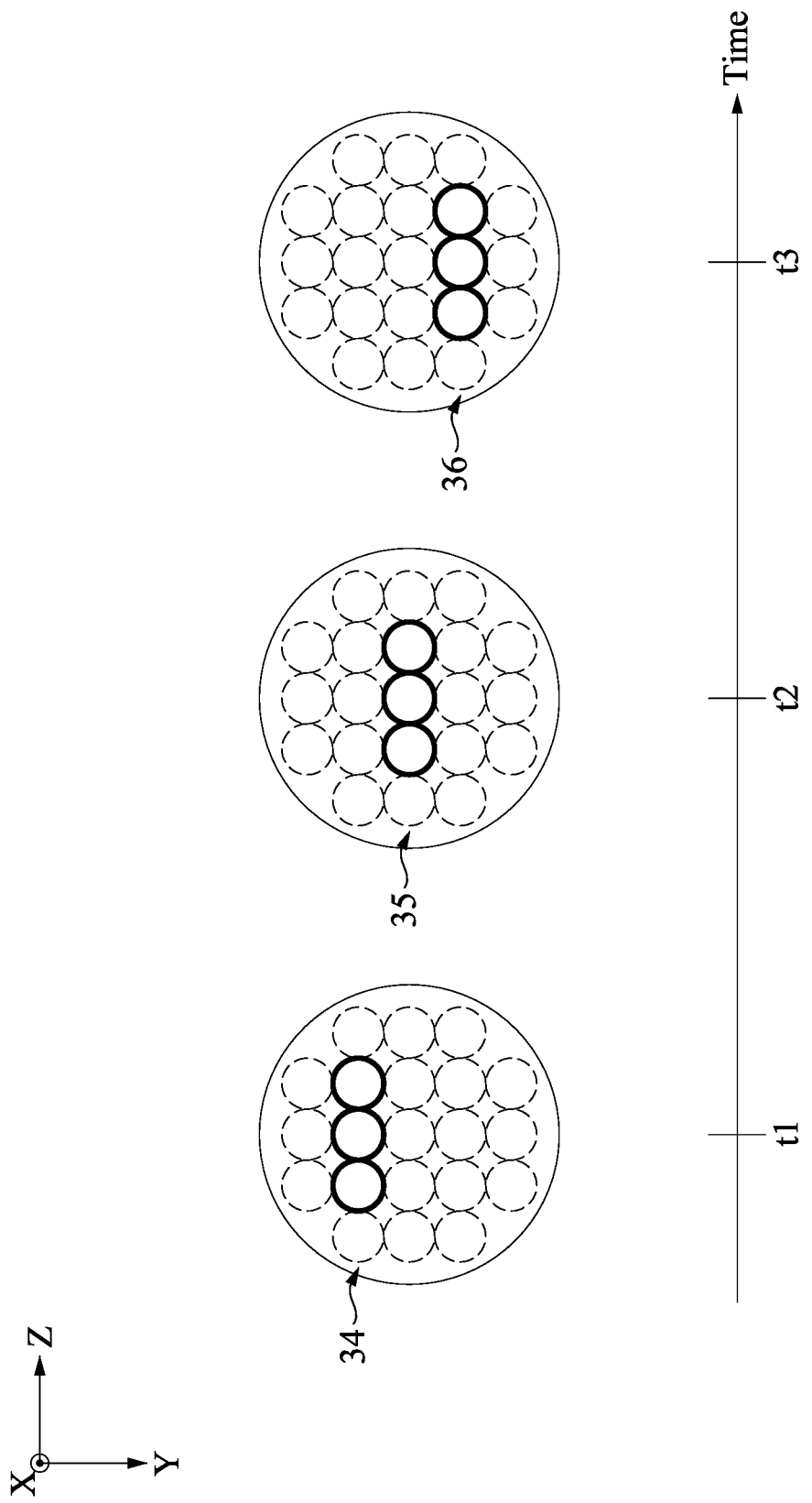
FIG. 10 shows a model for generating an elongate droplet by producing multiple small drops at each given time, in accordance with some embodiments.
Figure 11:
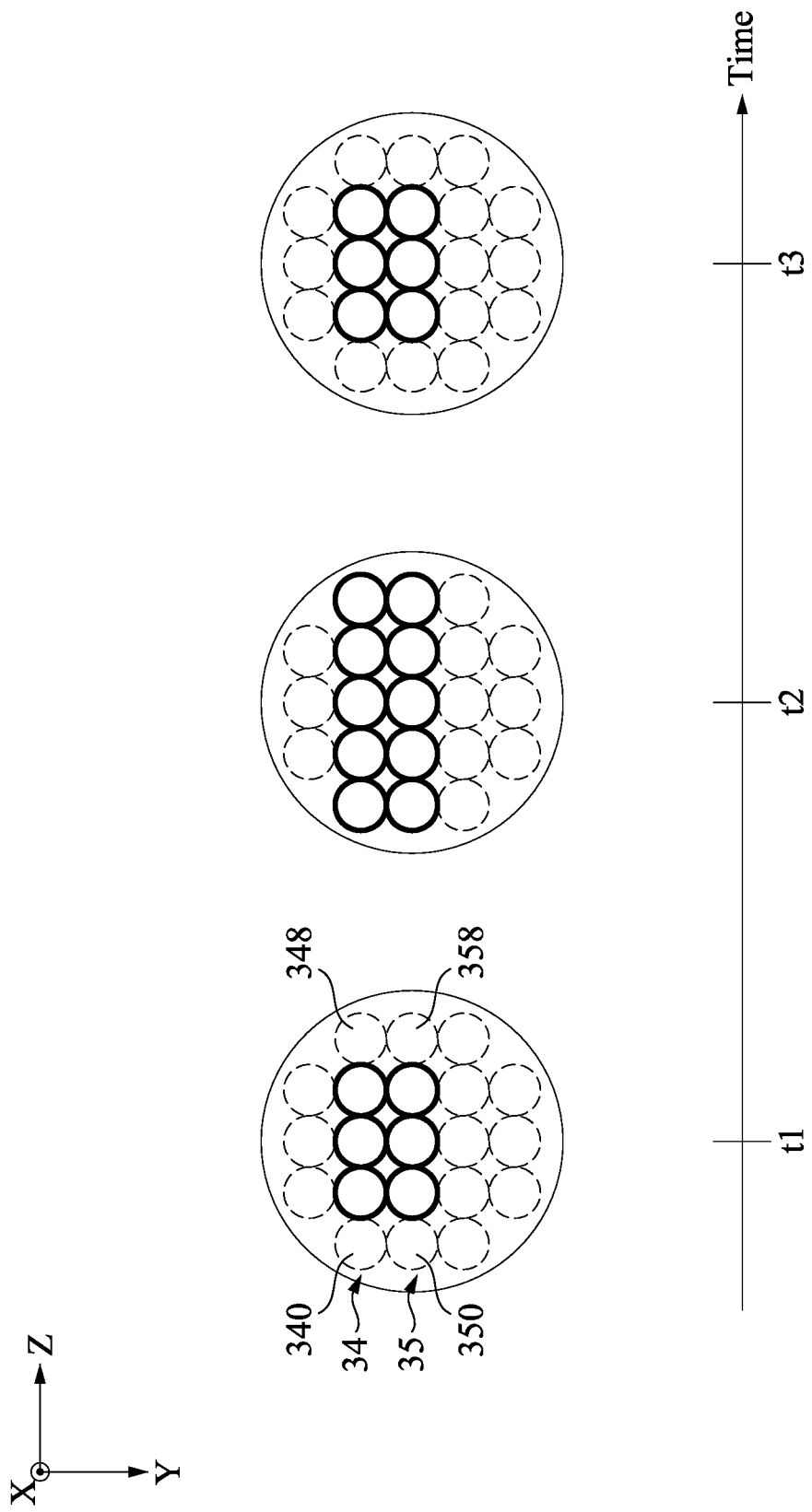
FIG. 11 shows a model for generating an elongate droplet by producing multiple small drops at each given time, in accordance with some embodiments.

In some embodiments, at time t1, time t2 and time t3 of each cycle for producing the elongated droplets as shown in FIG. 7, there are more than one nozzles are used to generate small drops of the target material so as to increase the dimension of the elongated droplets in the z-axis and/or y-axis. FIGS. 10 and 11 show two different models for generating an elongate droplet by producing multiple small drops at each given time, in accordance with some embodiments. In FIG. 10 and FIG. 11, nozzles that are actuated to produce small drops are depicted in solid line, and nozzles that are shut off and produce no small drops are depicted in dotted line.

In the model shown in FIG. 10, the small drops in the same group are generated by the nozzles arranged in rows, and the small drops from different row of the nozzles (i.e., different group of nozzles) are generated at different times. Specifically, three nozzles (depicted in solid line) in the second group of nozzles 34 are actuated to generate small drops of the target material at time t1, three nozzles in the third group of nozzles 35 are actuated to generate small drops of the target material at time t2, and three nozzles in the fourth group of nozzles 36 are actuated to generate small drops of the target material at time t3. An elongated droplet formed in the model shown in FIG. 10 has a greater length in y-axis direction in comparison to the elongate droplet aggregated by the small drop produced from the three nozzles in the third group of nozzles 35.

In the model shown in FIG. 11, the nozzles 340 and 348 in the second group of nozzles 34 and the nozzles 350 and 358 in the third group of nozzles 35 are shut off, and the remaining nozzles in the second group of nozzles 34 and the third group of nozzles 35 are actuated to provide small drops of the target material at time t1. At time t2, the nozzles 340, 348, 350 and 358 are actuated to provide small drops of the target material, and shut off again at time t3. An elongated droplet formed in the model shown in FIG. 11 has a greater length in y-axis direction in comparison to the elongate droplet aggregated by the small drop produced from the three nozzles in the third group of nozzles. Additionally, the elongated droplet formed in the model shown in FIG. 11 has a wider waist in the z-axis direction as seen along the y-axis direction.

The method S10 also include operation S12, in which the elongated droplet is irradiated with laser pulse 51 to convert the elongated droplet 82 to plasma which generates EUV light 84. In some embodiments, since the elongated droplet 82 has a greater length in the x-axis direction and has a less density in comparison to a droplet generated from a conventional droplet generator, a pre-pulse laser that is used to enlarge the size of the droplet and produce target mist of lower density can be omitted. As a result, the manufacturing cost in the lithography process is reduced. In addition, a maintenance process for correcting a spatial separation (MPPP) between the pre-pulse laser and the main-pulse laser can be canceled. In some embodiments, the elongated droplet 82 may have a larger size in comparison to a droplet generated from a conventional droplet generator, and therefore a higher EUV energy is produced.

The method S10 also includes operation S13, in which, the EUV radiation 84 is reflected by the reticle 18 and is further projected on the resist layer coated on the semiconductor wafer 22 (by the POB 20), thereby forming a latent image on the resist layer. In some embodiments, the lithography process is implemented in a scan mode. In some embodiments, a dose performance of the semiconductor wafer 22 is conducted by observing features on the semiconductor wafer 22 through proper tools, such as scanning electron microscope (SEM), for example.

The method S10 also includes operation S14, in which a measurement process is performed, and at least one condition of the elongated droplets 82 is measured by the metrology tool 71. At operation S15, a result of the measurement is compared with a preset value in operation S15 by the analyzer 73 so as to determine if a compensation process is performed or not. If the result of the measurement is different from the preset value the method continues with operation S16, in which a configurable parameter of the droplet generator 30 is adjusted based on the result of the measurement process.

In some embodiments, a distance in the z-axis between the elongated droplet 82 and the lighting point 52 of the laser pulse 51 is measured to determine if a compensation process is performed or not. Specifically, as shown in FIG. 12, a first elongated droplet $82_1$ is generated by actuating three nozzles in the third group of nozzles 35 that are arranged in the center region. When a misalignment between a first elongated droplet 82 and the focal point of the laser pulse 51 (i.e., the lighting point 52) in z-axis is detected by the analyzer 73 (FIG. 2), the controller 90 may transmit a control signal to stop the generation of small drops from the nozzle 354 and initiate the generation of small drops from the nozzle 350. Therefore, the position of the following elongated droplets (e.g., second elongated droplet $82_2$) in the z-axis is shifted, and the misalignment is compensated.

In some embodiments, a distance in the y-axis between the elongated droplet 82 and the lighting point 52 of the laser pulse 51 is measured to determine if a compensation process is performed or not. Specifically, as shown in FIG. 13, a first elongated droplet $82_1$ is generated by actuating three nozzles in the third group of nozzles 35 that are arranged in the center region. When a misalignment between a first elongated droplet 82 and the focal point of the laser pulse 51 (i.e., the lighting point 52) in y-axis is detected by the analyzer 73 (FIG. 2), the controller 90 may transmits a control signal to stop the generation of small drops from the third group of nozzles 35 and initiate the generation of small drops from the first group of nozzles 31. Therefore, the position of the following elongated droplets (e.g., second elongated droplet $82_2$) a second elongated droplet $82_2$ in the y-axis is shifted, and the misalignment is compensated.

In some embodiments, an energy of the EUV radiation 84 is measured to determine if a compensation process is performed or not. Specifically, as shown in FIG. 14, a first elongated droplet $82_1$ is generated by actuating three nozzles in the third group of nozzles 35 that are arranged in the center region. When a variation in EUV energy is detected by the analyzer 73 (FIG. 2), the controller 90 may transmits a control signal to increase or decrease the number of nozzles for supplying small drops to form a second elongated droplet $82_2$ with different sizes from that of the first elongated droplet $82_1$.

For example, as shown in FIG. 14, the controller 90 may increase the dimension of the second elongated droplet $82_2$ in z-axis by actuating the nozzle 350 and the nozzle 358 to generate small drops of the target material. Therefore, a length of the second elongated droplet $82_2$ in z-axis is different from a length of the first elongated droplet $82_1$ in the z-axis. Alternatively, as shown in FIG. 15, the controller 90 may increase the dimension of the second elongated droplet $82_2$ by actuating another three nozzles in the second group of nozzles 34 to generate small drops of the target material. Therefore, a length of the second elongated droplet $82_2$ in y-axis is different from a length of the first elongated droplet $82_1$ in the y-axis. Similarly, the size of the second elongated droplet $82_2$ can be diminished by decreasing the number of the nozzles supplying the small drops of the target material if the measurement in EUV energy is greater than a preset value.

Figure 16:
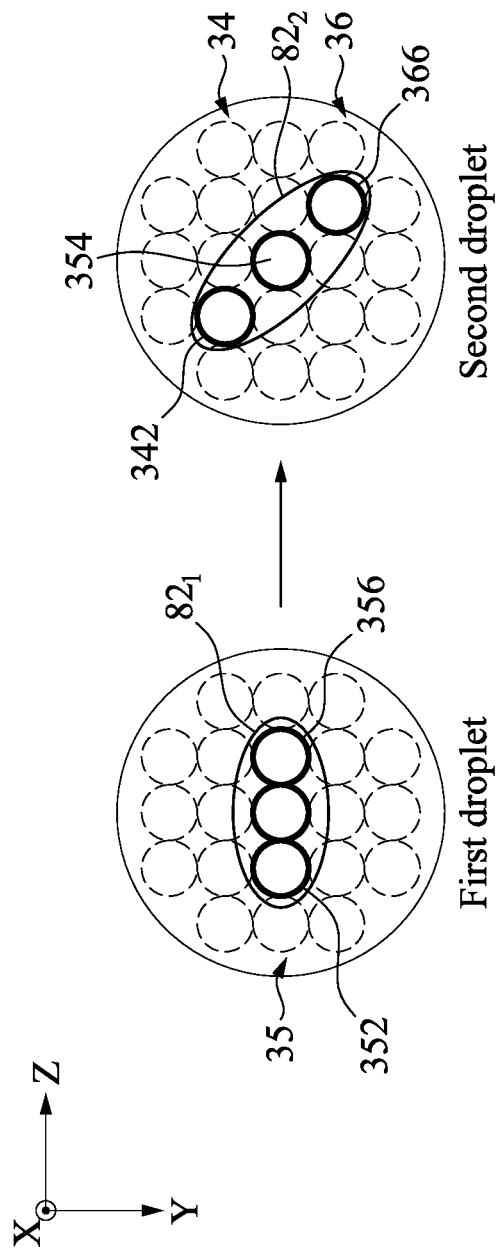
FIG. 16 shows a method for controlling a tilt angle of an elongated droplet relative to z-axis, in accordance with some embodiments of the present disclosure.

In some embodiments, a shift in an incident angle of the EUV radiation on the semiconductor wafer 22 can be detected by analyzing features on the semiconductor wafer 22 after the exposure of the EUV radiation, and therefore a dose error on the semiconductor wafer 22 is measured to determine if a compensation process is performed or not. For example, as shown in FIG. 16, when the shift in the incident angle of the EUV radiation is detected, the controller 90 may terminate the nozzles 352 and 356 in the third group of nozzles 35, and initiate a nozzle 342 in the second group of nozzles 34 and a nozzle 366 in the fourth group of nozzle 36. The nozzle 342 is adjacent to the nozzle 352, and the nozzle 366 is adjacent to the nozzle 356. After the adjustment, the second elongated droplet $82_2$ is oblique in different angles with the z-axis (or y-axis) from the first elongated droplet $82_1$. In addition, the second elongated droplet $82_2$ has a lower density than the first elongated droplet $82_1$ since the nozzles 342, 354, and 366 are arranged in the expanded fashion.

FIG. 17 shows a block diagram of a controller 90, in accordance with some embodiments. The controller 90 generates output control signals for controlling operations of droplet generator 30 and the laser generator 50 and other components of the droplet generator 30 and the laser generator 50, in accordance with some embodiments. In some embodiments, the controller 90 includes a processor 94, an input/output (I/O) device 92, a memory 96, and a network interface 98 each communicatively coupled via an interconnection communication mechanism.

The processor 94 is arranged to execute and/or interpret one or more set of instructions 97 stored in the memory 96. In some embodiments, the processor 94 is a central processing unit (CPU), a multi-processor, a distributed processing system, an application specific integrated circuit (ASIC), and/or a suitable processing unit. The processor 94 may utilize the logic of proportional-integral-derivative (DIP) to determine the operation of the droplet generator 30 and the laser generator 50 based on the data collected by the monitoring device 70.

The I/O device 92 is coupled to external circuitry. In some embodiments, the I/O device 92 includes a keyboard, keypad, mouse, trackball, trackpad, and/or cursor direction keys for communicating information and commands to the processor 94.

The memory 96 (also referred to as a computer-readable medium) includes a random access memory or other dynamic storage device, communicatively coupled to the bus for storing data and/or instructions for execution by the processor 94. In some embodiments, the memory 96 is used for storing temporary variables or other intermediate information during execution of instructions to be executed by the processor 94. In some embodiments, the memory 96 also includes a read-only memory or other static storage device coupled to the bus for storing static information and instructions for the processor 94. In some embodiments, the memory 96 is an electronic, magnetic, optical, electromagnetic, infrared, and/or a semiconductor system (or apparatus or device). For example, the memory 96 includes a semiconductor or solid-state memory, a magnetic tape, a removable computer diskette, a random access memory (RAM), a read-only memory (ROM), a rigid magnetic disk, and/or an optical disk. In some embodiments using optical disks, the memory 96 includes a compact disk-read only memory (CD-ROM), a compact disk-read/write (CD-R/W), and/or a digital video disc (DVD). The memory 96 may store information in relation to the historical data of the droplet position, energy value of EUV radiation in the lithography system 10 or the dose performance on the semiconductor wafer 22.

The memory 96 is encoded with, i.e., storing, the computer program code, i.e., a set of executable instructions 97, for controlling one or more components of the droplet generator 30 and the laser generator 50 to perform the method S10. In some embodiments, the memory 96 also stores information for performing the method S10 as well as information generated during performing the method S10.

The network interface 98 includes a mechanism for connecting to a network 99, to which one or more other computer systems are connected. In some embodiments, the network interface 98 includes a wired and/or wireless connection mechanism. The network interface 98 includes wireless network interfaces such as BLUETOOTH, WIFI, WIMAX, GPRS, or WCDMA; or wired network interface such as ETHERNET, USB, or IEEE-1394. In some embodiments, the controller 90 is coupled with one or more components of the droplet generator 30 and the laser generator 50 via the network interface 98. In some embodiments, the controller 90 is directly coupled with one or more components of the droplet generator 30 and the laser generator 50, e.g., with the components coupled to the bus instead of via the network interface 98.

Embodiments of the present disclosure provide a method for generating an elongated droplet having a pancake-shaped with the use of multiple nozzles which generate a number of small drops for aggregating the elongated droplet. Since the elongated droplet has a larger size and a lower density than a droplet generated from a conventional droplet generator, the demand for using a pre-pulse laser to hit the droplet is no longer exists. As a result, the manufacturing cost and a downtime for performing a maintenance process to the lithography exposure system are reduced. Additionally, since the nozzles of the droplet generator can be selectively actuated of the to generate a number of small drops of the target material, configurable parameters of the EUV light source can be controlled by changing the nozzles ejecting the small drops according to real-time collected data. Therefore, energy conversion efficiency and EUV stability are significantly improved.

In accordance with some embodiments, a lithography method in semiconductor fabrication is provided. The method includes generating multiple groups of small drops of a target material through a number of nozzles in such a way that small drops in each of the groups are aggregated to an elongated droplet of the target material. The method also includes generating a laser pulse from a laser generator to convert the elongated droplets to plasma which generates an EUV radiation. The method further includes exposing a semiconductor wafer to the EUV radiation. In some embodiments, the small drops from the nozzles are transmitted along a first axis, and a longitudinal axis of each of the elongated droplets is oblique with the first axis. In some embodiments, the small drops in the same group are generated at different times. In some embodiments, the small drops in the same group are generated by the nozzles arranged in rows, and the small drops from different rows of the nozzles are generated at different times. In some embodiments, the small drops of the target material are generated by the nozzles that are separated from one the other by a distance, and a ratio of the distance and a width of one of the nozzles is in a range from about 0 to about 1. In some embodiments, before being hit by the laser pulse, a first one of the elongated droplets aggregated from a first group of small drops has a size that is different from that of a second one of the elongated droplets aggregated from a second group of small drops. In some embodiments, as being hit by the laser pulse, a first one of the elongated droplets aggregated from a first group of small drops and a second one of the elongated droplets aggregated from a second group of small drops are offset from a focal point of the laser pulse by different distances. In some embodiments, the method further includes reflecting the EUV radiation emitted from the plasma by a collector mirror having an optical axis. Before being hit by the laser pulse, a first one of the elongated droplets aggregated from a first group of small drops and a second one of the elongated droplets aggregated from a second group of small drops are oblique with the optical axis of the collector mirror by different angles. In some embodiments, the method further includes performing a measurement process to measure a condition of a first one of the elongated droplets aggregated from a first group of small drops or the EUV radiation irradiated by the first one of the elongated droplets and selecting the nozzles for generating a second one of the elongated droplets according to a result of the measurement process.

In accordance with some embodiments, a lithography method in semiconductor fabrication is provided. The method includes generating a plurality of elongated droplets of a target material along a first axis from a droplet generator. Each of the elongated droplets has a longitudinal axis that is oblique with the first axis and has a length in the longitudinal axis greater than its width perpendicular to the longitudinal axis. The method also includes generating a laser pulse from a laser generator to convert the elongated droplets to plasma which generates an EUV radiation. The method further includes exposing a semiconductor wafer to the EUV radiation. In some embodiments, each of the elongated droplets is aggregated by a plurality of small drops of the target material that are generated from a plurality of nozzles of the droplet generator. In some embodiments, the small drops for aggregating one of the elongated droplets are generated from the nozzles at different times. In some embodiments, the small drops for aggregating one of the elongated droplets are generated from the nozzles arranged in rows, and the small drops from different rows of the nozzles are generated at different times. In some embodiments, the small drops of the target material are generated by the nozzles that are separated from one another by a distance, and a ratio of the distance and a width of one of the nozzles is in a range from about 0 to about 1. In some embodiments, before being hit by the laser pulse, a first one of the elongated droplets has a size that is different from that of a second one of the elongated droplets. In some embodiments, as being hit by the laser pulse, a first one of the elongated droplets and a second one of the elongated droplets are offset from a focal point of the laser pulse by different distances. In some embodiments, the method further includes reflecting the EUV radiation emitted from the plasma by a collector mirror having an optical axis. Before being hit by the laser pulse, a first one of the elongated droplets and a second one of the elongated droplets are oblique with the optical axis of the collector mirror by different angles. In some embodiments, the method further includes performing a measurement process to measure a condition of a first one of the elongated droplets or an energy of the EUV radiation emitted from the first one of the elongated droplets; and determining a dimension of a second one of the elongated droplets according to a result of the detection.

In accordance with yet another embodiments, an lithography exposure system is provided. The apparatus includes a droplet generator used to generate a plurality of elongated droplets of the a target material. The droplet generator includes a reservoir for storing the target material. The droplet generator also includes a number of nozzles fluidly connected to the reservoir, wherein the nozzles are arranged such that small drops of the target material from different nozzles are aggregated to one of the elongated droplets. The apparatus also includes a laser generator configured to generate a laser pulse to convert the elongated droplets to plasma which generates a EUV radiation. The apparatus further includes a collector mirror configured to reflect the EUV radiation. In some embodiments, the lithography exposure system further includes a metrology tool configured to detect a condition of the elongated droplets or an energy of the EUV radiation and a controller coupled to the metrology tool. The controller is programmed to determine which nozzles of the droplet generator are used to generate the small drops of the target material based on a result produced by detecting the condition of one of the elongated droplets previously generated or the EUV radiation emitted by one of the elongated droplets previously generated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method in semiconductor fabrication, comprising:
    generating multiple groups of small drops of a target material through a plurality of nozzles in such a way that the small drops in each of the groups are aggregated to an elongated droplet of the target material;
    generating a laser pulse from a laser generator to convert the elongated droplets to plasma which generates an EUV radiation;
    exposing a semiconductor wafer to the EUV radiation;
    performing a measurement process to measure a condition of a first one of the elongated droplets aggregated from a first group of small drops or the EUV radiation irradiated by the first one of the elongated droplets; and
    selecting the nozzles for generating a second one of the elongated droplets according to a result of the measurement process.

2. The lithography method of claim 1, wherein the small drops from the nozzles are transmitted along a first axis, and a longitudinal axis of each of the elongated droplets is oblique with the first axis.

3. The lithography method of claim 1, wherein the small drops in the same group are generated at different times.

4. The lithography method of claim 1, wherein the small drops in the same group are generated by the nozzles arranged in rows, and the small drops from different rows of the nozzles are generated at different times.

5. The lithography method of claim 1, wherein the small drops of the target material are generated by the nozzles that are separated from one the other by a distance, and a ratio of the distance and a width of one of the nozzles is in a range from about 0 to about 1.

6. The lithography method of claim 1, wherein before being hit by the laser pulse, the first one of the elongated droplets aggregated from the first group of small drops has a size that is different from that of the second one of the elongated droplets aggregated from a second group of small drops.

7. The lithography method of claim 1, wherein as being hit by the laser pulse, the first one of the elongated droplets aggregated from the first group of small drops and the second one of the elongated droplets aggregated from a second group of small drops are offset from a focal point of the laser pulse by different distances.

8. The lithography method of claim 1, further comprising:
    reflecting the EUV radiation emitted from the plasma by a collector mirror having an optical axis;
    wherein before being hit by the laser pulse, the first one of the elongated droplets aggregated from the first group of small drops and the second one of the elongated droplets aggregated from a second group of small drops are oblique with the optical axis of the collector mirror by different angles.

9. A lithography method in semiconductor fabrication, comprising:
    generating a plurality of elongated droplets of a target material along a first axis from a droplet generator, wherein each of the elongated droplets has a longitudinal axis that is oblique with the first axis and has a length in the longitudinal axis greater than its width perpendicular to the longitudinal axis, wherein each of the elongated droplets is aggregated by a plurality of small drops of the target material that are generated from a plurality of nozzles of the droplet generator, the small drops of the target material are generated by the nozzles that are separated from one another by a distance, and a ratio of the distance and a width of one of the nozzles is in a range from about 0 to about 1;
    generating a laser pulse from a laser generator to convert the elongated droplets to plasma which generates an EUV radiation; and
    exposing a semiconductor wafer to the EUV radiation.

10. The lithography method of claim 9, wherein the small drops for aggregating one of the elongated droplets are generated from the nozzles at different times.

11. The lithography method of claim 9, wherein the small drops for aggregating one of the elongated droplets are generated from the nozzles arranged in rows, and the small drops from different rows of the nozzles are generated at different times.

12. The lithography method of claim 9, wherein before being hit by the laser pulse, a first one of the elongated droplets has a size that is different from that of a second one of the elongated droplets.

13. The lithography method of claim 9, wherein as being hit by the laser pulse, a first one of the elongated droplets and a second one of the elongated droplets are offset from a focal point of the laser pulse by different distances.

14. The lithography method of claim 9, further comprising:
reflecting the EUV radiation emitted from the plasma by a collector mirror having an optical axis;
wherein before being hit by the laser pulse, a first one of the elongated droplets and a second one of the elongated droplets are oblique with the optical axis of the collector mirror by different angles.

15. The lithography method of claim 9, further comprising:
performing a measurement process to measure a condition of a first one of the elongated droplets or an energy of the EUV radiation emitted from the first one of the elongated droplets; and
determining a dimension of a second one of the elongated droplets according to a result of the measurement.

16. A lithography exposure system, comprising:
a droplet generator configured to generate a plurality of elongated droplets of a target material and comprising:
a reservoir for storing the target material; and
a plurality of nozzles fluidly connected to the reservoir, wherein the nozzles are arranged such that small drops of the target material from different nozzles are aggregated to one of the elongated droplets, wherein the nozzles have central longitudinal axes that are substantially parallel and that are spaced apart in a direction substantially perpendicular to an extension direction of the central longitudinal axes of the nozzles;
a laser generator configured to generate a laser pulse to convert the elongated droplets to plasma which generates a EUV radiation; and
a collector mirror configured to reflect the EUV radiation.

17. The lithography exposure system of claim 16, further comprising:
a metrology tool configured to detect a condition of the elongated droplets or an energy of the EUV radiation; and
a controller coupled to the metrology tool and programmed to:
determine which nozzles of the droplet generator are used to generate the small drops of the target material based on a result produced by detecting the condition of one of the elongated droplets previously generated or the EUV radiation emitted by one of the elongated droplets previously generated.

18. The lithography exposure system of claim 16, wherein a distance between adjacent two of the nozzles is less than a width of one of the nozzles.

19. The lithography exposure system of claim 16, wherein the nozzles are arranged in a staggered arrangement.

20. The lithography exposure system of claim 16, wherein the nozzles comprise first and second groups of nozzles, the first group of nozzles are arranged substantially along a first imaginary circular line, the second group of nozzles are arranged along a second imaginary circular line, and the first imaginary circular line and the second imaginary circular line are substantially concentric.

* * * * *